United States Patent
Chu et al.

(10) Patent No.: US 8,816,708 B2
(45) Date of Patent: Aug. 26, 2014

(54) ELECTRONIC TEST SYSTEM AND ASSOCIATED METHOD

(75) Inventors: Shin-Cheng Chu, Taipei (TW);
Ching-Tsung Chen, Tainan (TW);
Teng-Hui Lee, Hsinchu County (TW);
Chia-Jen Kao, Hsinchu (TW)

(73) Assignees: Global Unichip Corporation, Hsinchu (TW); Taiwan Semiconductor Manufacturing Co., Ltd, Hsin-Chu (TW)

( * ) Notice: Subject to any disclaimer, the term of this patent is extended or adjusted under 35 U.S.C. 154(b) by 224 days.

(21) Appl. No.: 13/547,094

(22) Filed: Jul. 12, 2012

(65) Prior Publication Data

US 2013/0113508 A1    May 9, 2013

(30) Foreign Application Priority Data

Nov. 3, 2011   (TW) .............................. 100140205 A

(51) Int. Cl.

| | | |
|---|---|---|
| *G01R 31/00* | (2006.01) | |
| *G01R 1/00* | (2006.01) | |
| G01R 3/00 | (2006.01) | |
| G01R 5/00 | (2006.01) | |
| G01R 7/00 | (2006.01) | |
| G01R 9/00 | (2006.01) | |
| G01R 11/00 | (2006.01) | |
| G01R 13/00 | (2006.01) | |
| G01R 17/00 | (2006.01) | |
| G01R 19/00 | (2006.01) | |
| G01R 35/00 | (2006.01) | |

(52) U.S. Cl.
CPC ... *G01R 1/00* (2013.01); *G01R 3/00* (2013.01); *G01R 5/00* (2013.01); *G01R 7/00* (2013.01); *G01R 9/00* (2013.01); *G01R 11/00* (2013.01); *G01R 13/00* (2013.01); *G01R 17/00* (2013.01); *G01R 19/00* (2013.01); *G01R 35/00* (2013.01)
USPC ............ 324/750.01; 324/750.02; 324/750.24; 324/754.01; 324/754.03; 324/754.07

(58) Field of Classification Search
CPC .............. G01R 1/00; G01R 3/00; G01R 5/00; G01R 7/00; G01R 9/00; G01R 11/00; G01R 13/00; G01R 17/00; G01R 19/00; G01R 35/00; G01R 2019/00; G01R 2031/00
USPC ............. 324/750.01, 750.02, 750.24, 754.01, 324/754.03, 754.07, 756.04, 756.05
See application file for complete search history.

(56) References Cited

U.S. PATENT DOCUMENTS

| | | | |
|---|---|---|---|
| 8,269,515 B2 * | 9/2012 | Mayder .................... | 324/754.07 |
| 2011/0043233 A1 * | 2/2011 | Arkin et al. ............. | 324/755.03 |
| 2012/0242357 A1 * | 9/2012 | Eccles ...................... | 324/750.01 |
| 2013/0002272 A1 * | 1/2013 | Badaroglu et al. ....... | 324/750.01 |

* cited by examiner

*Primary Examiner* — Huy Q Phan
*Assistant Examiner* — Temilade S Rhodes-Vivour
(74) *Attorney, Agent, or Firm* — WPAT, PC; Justin King

(57) ABSTRACT

Electronic test system and associated method, including a first and a second connection terminals respectively coupled to two pins of a chip under test, a signal source terminal coupled to a signal generator, a first and a second measurement terminals coupled to a tester, a fifth switch, a seventh switch and a switch circuit which has a first and a fourth front terminals coupled to the signal source terminal, has a first and a fourth back terminals coupled to the first and second connection terminals, and controls conduction between the first front terminal and the first back terminal, as well as conduction between the fourth front terminal and the fourth back terminal. The fifth switch is coupled between the fourth back terminal and the first measurement terminal, and the seventh switch is coupled between the first connection terminal and the second measurement terminal.

15 Claims, 21 Drawing Sheets

ELECTRONIC TEST SYSTEM AND ASSOCIATED METHOD

This application claims the benefit of Taiwan Patent Application No. 100140205, filed Nov. 3, 2011, the subject matter of which is incorporated herein by reference.

FIELD OF THE INVENTION

The present invention relates to an electronic test system and associated method, and more particularly, to an electronic test system and associated method for electrical over-stress (EOS) testing.

BACKGROUND OF THE INVENTION

Chips (integrated circuits) form one of the most important hardware foundations of modern information society. A chip is equipped with conductive pins, such as power pins, ground pins and signal pins. A chip is respectively coupled to supply voltage(s) and ground voltage via the power pins and ground pins to drain power for operation. A chip also exchanges signals with other external circuitry (e.g., a circuit board or another chip) via the signal pins.

However, because the power pins, ground pins and signal pins are conductive, external electrical interferences can also be conducted to interior of the chip. EOS is one kind of electric interferences; EOS acts as a high-voltage waveform of considerable time span which propagates from a pin to another pin of a chip, and thus owns great potential to damage the chip.

To address the EOS issue, EOS test is performed for chips. During EOS test, a signal generator provides a waveform to emulate EOS; as two terminals of the signal generator are coupled to two pins of a chip, reaction between the two pins under EOS can be tested. In a chip, since EOS could zap from a signal pin to a ground pin, from a power pin to a signal pin, from a ground pin to a signal pin and from a signal pin to a power pin, EOS test has to cover all these four possible scenarios. However, because a chip has many signal pins and each of the signal pins requires individual test, known prior art has to manually couple the two terminals of the signal generator to associated signal pin, power pin and ground pin, and therefore suffers from time-consuming labor and error-prone issue.

SUMMARY OF THE INVENTION

To overcome disadvantages of prior art, the invention relates to an electronic test system and associated method for automatic EOS test.

An objective of the invention is providing an electronic test system for testing a chip, including a plurality of first connection terminals, a plurality of second connection terminals, a signal source terminal and a second signal source terminal, a first measurement terminal and a second measurement terminal, a switch circuit, a fifth switch, a plurality of sixth switches and seventh switches, a source switch and a second source switch, a plurality of eighth switches and a switch control circuit. Each first connection terminal is coupled to one of power pins and ground pins of the chip; each second connection terminal is coupled to a signal pin of the chip. The signal source terminal and the second signal source terminal are respectively coupled to two terminals of a signal generator. The first measurement terminal and the second measurement terminal are respectively coupled to two terminals of a tester.

The switch circuit has a first front terminal, a second front terminal, a third front terminal and a fourth front terminal, and a first back terminal, a second back terminal, a third back terminal and a fourth back terminal. The source switch is coupled between the signal source terminal and the first front terminal for selectively conducting between the signal source terminal and the first front terminal; the first front terminal is also coupled to the fourth terminal, such that the first front terminal and the fourth front terminal are both coupled to the signal source terminal by the source switch. Similarly, the second source switch is coupled between the second signal source terminal and the second front terminal for selectively conducting between the second signal source terminal and the second front terminal; the second front terminal is also coupled to the third front terminal, such that both the second front terminal and the third front terminal are coupled to the second signal source terminal by the second source switch. The switch circuit can includes a first to a fourth switches, the first switch is coupled between the first front terminal and the first back terminal, the second switch is coupled between the second front terminal and the second back terminal, the third switch is coupled between the third front terminal and the third back terminal, the fourth switch is coupled between the fourth front terminal and the fourth back terminal.

The fifth switch is coupled between the fourth back terminal and the first measurement terminal for selectively conducting between the fourth back terminal and the first measurement terminal. The third back terminal is also coupled to the fourth back terminal. The second back terminal is also coupled to the first back terminal.

The plurality of sixth switches and seventh switches respectively associate with the plurality of first connection terminals. Each seventh switch is coupled between the second measurement terminal and the associated first connection terminal for selectively conducting between the second measurement terminal and the associated first connection terminal. Each sixth switch is coupled between the first back terminal and the associated first connection terminal for selectively conducting between the first back terminal and the associated first connection terminal.

The plurality of eighth switches respectively associate with the plurality of second connection terminal; each eighth switch is coupled between the third back terminal and the associated second connection terminal for selectively conducting between the third back terminal and the associated second connection terminal.

The switch control circuit is coupled to the fifth to the eight switches, the source switch and the second source switch, and controls their conduction; the switch control circuit is also coupled to the switch circuit to control conduction of the switch circuit.

The electronic test system is capable of operating in a check mode (e.g., a switch circuit check mode), a second check mode (e.g., a switch check mode), a third check mode (e.g., a continuity check mode) and an EOS test mode.

While operating in the check mode (e.g., the switch circuit check mode), the fifth switch, one or more sixth switches and one or more seventh switches conducts, the source switch and the second source switch do not conduct, each eighth switch does not have to conduct, and the switch circuit operates in a first switch mode and a second switch mode. When the switch circuit operates in the first switch mode, it does not conduct between the second front terminal and the second back terminal, and does not conduct between the third front terminal and the third back terminal, so as to check whether the conduction between the first front terminal and the first back terminal and the conduction between the fourth front terminal and the fourth back terminal can be normally controlled; that is, to check whether the first switch and the fourth switch can correctly function as expected. While operating in the second switch mode, the switch circuit does not conduct between the first front terminal and the first back terminal, and does not conduct between the fourth front terminal and the fourth back terminal, so as to check whether the conduction between the second front terminal and the second back terminal and the conduction between the third front terminal and the third back terminal can be correctly controlled, i.e., to check the second switch and the third switch.

When the electronic test system operates in the second check mode (e.g., the switch check mode), the fifth switch conducts, the source switch and the second source switch do not conduct, each eighth switch does not have to conduct, and the switch circuit conducts between the first front terminal and the first back terminal, conducts between the fourth front terminal and the fourth back terminal, dose not conduct between the third front terminal and the third back terminal, and does not conduct between the second front terminal and the second back terminal. In this way, each sixth switch and each seventh switch associated with each first connection terminal can be checked.

When the electronic test system operates in the third check mode (e.g., the continuity check mode), continuity from each signal pin to a power pin and a ground pin can be checked via each second connection terminal. During the third check mode, for checking a signal pin associated with a second connection terminal, the fifth switch conducts, one or more seventh switches conduct, each sixth switch does not conduct, the eighth switch associated with the second connection terminal conduct, the source switch and the second source switch both do not conduct, the switch circuit does not conduct between the first, second, third, fourth front terminals and the first, second, third, fourth back terminals, and a negative current is fed to the first measurement terminal, thus the continuity between the signal pin and an associated ground pin can be checked. Furthermore, the continuity between the signal pin and an associated power pin can be checked by feeding a positive current to the first measurement terminal.

When the electronic test system operates in the EOS test mode, each signal pin can be tested via its associated second connection terminal. Under the test mode, for testing a signal pin associated with a second connection terminal, the fifth switch and each seventh switch do not conduct, the source switch and the second source switch conduct, the eighth switch associated with the second connection terminal conducts, the sixth switch associated with a ground pin conducts, the switch circuit conducts between the third front terminal and the third back terminal, conducts between the first front terminal and the first back terminal, does not conduct between the second front terminal and the second back terminal and does not conduct between the fourth front terminal and the fourth back terminal, and the EOS test from the signal pin to the ground pin can be performed. When the switch circuit conducts between the second front terminal and the second back terminal, conducts between the fourth front terminal and the fourth back terminal, does not conduct between the third front terminal and the third back terminal and does not conduct between the first front terminal and the first back terminal, the EOS test from the ground pin to the signal pin is performed.

During the test mode, when a sixth switch associated with a power pin conducts and the sixth switch associated with the ground pin stops conducting, EOS test between the signal pin and the power pin can be executed. When the switch circuit conducts between the third front terminal and the third back terminal, conducts between the first front terminal and the first back terminal, does not conduct between the second front terminal and the second back terminal and does not conduct between the fourth front terminal and the fourth back terminal, the EOS test from the signal pin to the power pin is performed. When the switch circuit conducts between the second front terminal and the second back terminal, conducts between the fourth front terminal and the fourth back terminal, does not conduct between the third front terminal and the third back terminal and does not conduct between the first front terminal and the first back terminal, the EOS test from the power pin to the signal pin is performed.

An objective of the invention is providing a method applied to the aforementioned electronic test system, including: for function check of the switch circuit, controlling the fifth switch to conduct the first measurement terminal to the fourth back terminal, controlling a seventh switch and one or more sixth switches to conduct the second measurement terminal to one or more first connection terminals and the first back terminal, controlling the source switch not to conduct between the signal source terminal and the first front terminal, and controlling the second source switch not to conduct between the second signal source terminal and the third front terminal.

Continuity check from a signal pin to a ground pin and a power pin can be performed by: controlling the fifth switch to conduct the first measurement terminal to the fourth back terminal, controlling each seventh switch to conduct each first connection terminal to the second measurement terminal, controlling each sixth switch not to conduct between each first connection terminal and the first back terminal, controlling an eighth switch to conduct a second connection terminal associated with the signal pin to the fourth back terminal, and controlling the switch circuit not to conduct between the first front terminal and the first back terminal, between the second front terminal and the second back terminal, between the third front terminal and the third back terminal and between the fourth front terminal and the fourth back terminal.

Checking a seventh switch and a sixth switch associated with a first connection terminal can be accomplished by: controlling the switch circuit to conduct the first front terminal to the first back terminal, and to conduct the fourth front terminal to the fourth back terminal; controlling the source switch not to conduct between the signal source terminal and the first front terminal, controlling the second source switch not to conduct between the second signal source terminal and the second front terminal, and controlling the fifth switch to conduct.

The EOS test for a signal pin associated with a second connection terminal is performed by: controlling the eighth switch associated with the second connection terminal to conduct, controlling the seventh switch not to conduct, controlling the fifth switch not to conduct, controlling the switch circuit not to conduct between the first front terminal and the first back terminal, to conduct between the second front terminal and the second back terminal, not to conduct between the third front terminal and the third back terminal, and to conduct between the fourth front terminal and the fourth back terminal; also, controlling a sixth switch to conduct between the second back terminal and a ground pin or a power pin associated with a first connection terminal. Hence, the signal source terminal and the second signal source terminal can be respectively conducted to the signal pin and the power or ground pin via the second connection terminal and the first connection terminal. By controlling the switch circuit to conduct between the first front terminal and the first back terminal, not to conduct between the second front terminal and the second back terminal, to conduct between the third front terminal and the third back terminal and not to conduct between the fourth front terminal and the fourth back terminal, thus the second signal source terminal and the signal source terminal can be respectively conducted to the signal pin and the power or ground pin via the second connection terminal and the first connection terminal.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
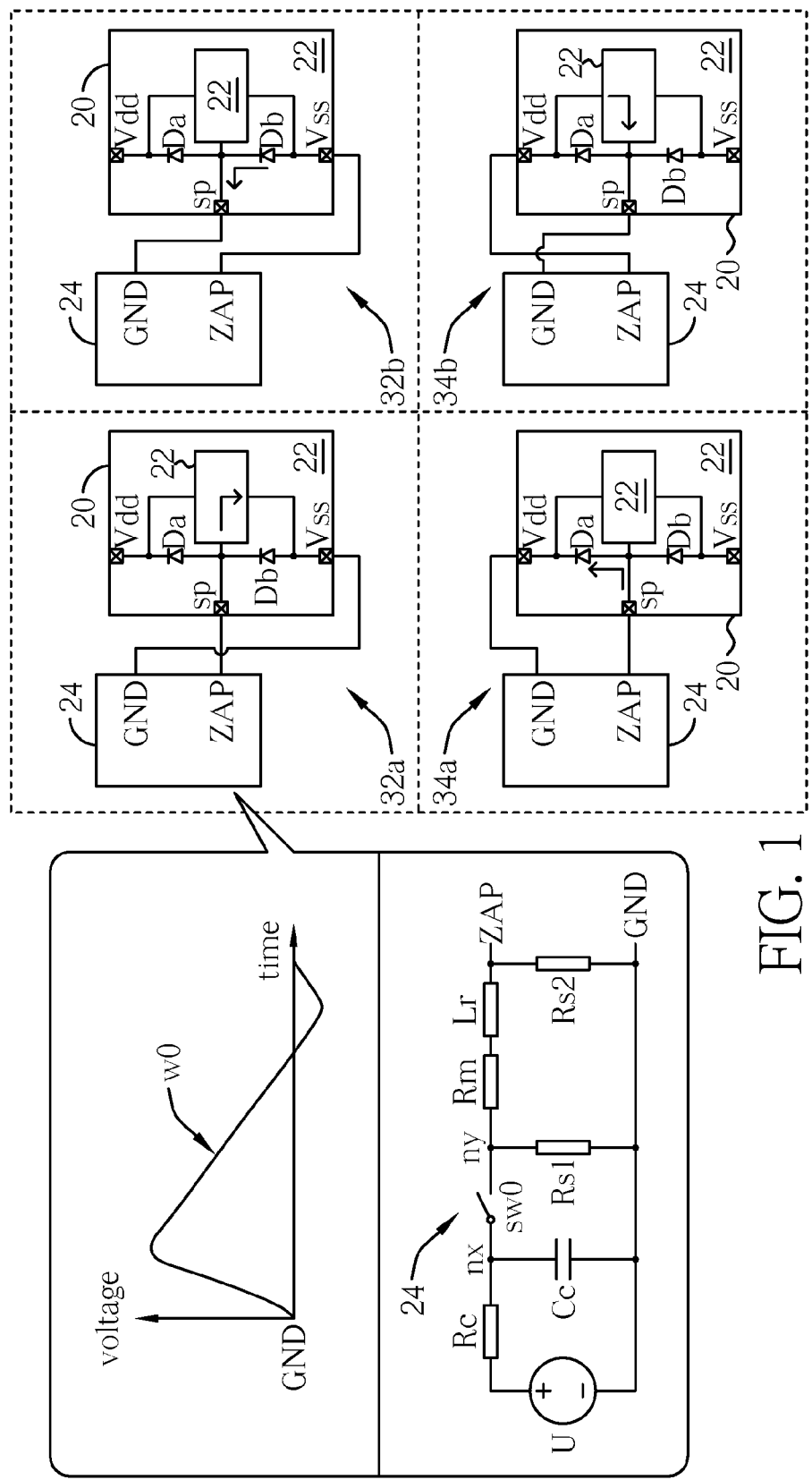
FIG. 1 depicts illustration of EOS tests.

Please refer to FIG. 1 illustrating several test scenarios for EOS test of a chip 20. The chip 20 can have a plurality of signal pins, one or more power pins and one or more ground pins, respectively represented by the pins sp, Vdd and Vss. An internal circuit 22 of the chip 20 drains power from the pins Vdd and Vss, and exchanges signals via the pin sp. A protection circuit, e.g., an electrostatic discharge (ESD) protection circuit, is arranged between the pins sp and Vdd, and between the pins sp and Vss; the protection circuit can be represented by two diodes Da and Db. The internal circuit 22 can have one or more power domains (not shown); each power domain has its own power pin(s) and/or ground pin(s). For example, different power domains can drain different supply voltages from respective power pins, and/or, different power domains can be coupled to ground voltage by respective ground pins.

For EOS test of the pin sp, a signal generator 24 is utilized to generate a voltage waveform of EOS; FIG. 1 depicts an embodiment w0 of the waveform, also illustrates a circuit architecture embodiment of the signal generator 24. In the embodiment of FIG. 1, the signal generator 24 includes a voltage source U for providing a high voltage, resistors Rc, Rm, Rs1 and Rs2, a switch sw0, a capacitor Cc and an inductor Lr, so as to provide the voltage waveform w0 between two signal terminals ZAP and GND for EOS test. The switch sw0 is coupled between nodes nx and ny, the resistor Rc is coupled between the voltage source U and the node nx, the capacitor Cc is coupled between the node nx and the signal terminal GND; the resistor Rm and the inductor Lr are serially coupled between the node ny and the signal terminal ZAP, the resistor Rs1 is coupled between the node ny and the signal terminal GND, and the resistor Rs2 is coupled between the signal terminals ZAP and GND. Before generation of the waveform w0, the switch sw0 is open (not conducting), and the voltage source U charges the capacitor Cc through the resistor Rc. Then the switch sw0 is closed (conducting), so the charges in the capacitor Cc flow to the node ny and form the waveform w0 by reactions of the resistors Rs1, Rs2 and the inductor Lr. The resistors Rs1 and Rs2 can control duration (time span) of the waveform w0, the inductor Lr shapes rise time of the waveform w0, and the resistor Rm is utilized for impedance match.

In a scenario 32a of EOS test, a positive EOS with respect to the ground pin(s) is tested. In this scenario 32a, all power pins (the pin Vdd for example) of the chip 20 are open, all ground pins (the pin Vss for example) are commonly coupled to the signal terminal GND to be grounded, and the signal pin sp under test is alone coupled to the signal terminal ZAP; with such arrangement, the EOS from the signal pin sp to the ground pin Vss is emulated. In a scenario 32b, a negative EOS with respect to the ground pin(s) is tested; all power pins (e.g., the pin Vdd) of the chip 20 are open, all ground pins (e.g., the pin Vss) are commonly coupled to the signal terminal ZAP, and the signal pin sp under test is coupled to the signal terminal GND, thus the EOS from the ground pin Vss to the signal pin sp can be tested.

In a scenario 34a, a positive EOS with respect to the power pin is tested. In the scenario 34a, one of the power pins (e.g., the pin Vdd) of the chip 20 is alone coupled to the signal terminal GND, all ground pins (e.g., the pin Vss) are open, and the signal pin sp under test is alone coupled to the signal terminal ZAP; in this way, the EOS from the signal pin sp to the power pin Vdd can be emulated. In a scenario 34b, a negative EOS with respect to the power pin is tested. In the scenario 34b, one of the power pins (e.g., the pin Vdd) of the chip 20 is alone coupled to the signal terminal ZAP, all ground pins (e.g., the pin Vss) are open, and the signal pin sp under test is alone coupled to the signal terminal GND, so the EOS from the power pin Vdd to the signal pin sp can be tested.

Figure 2:
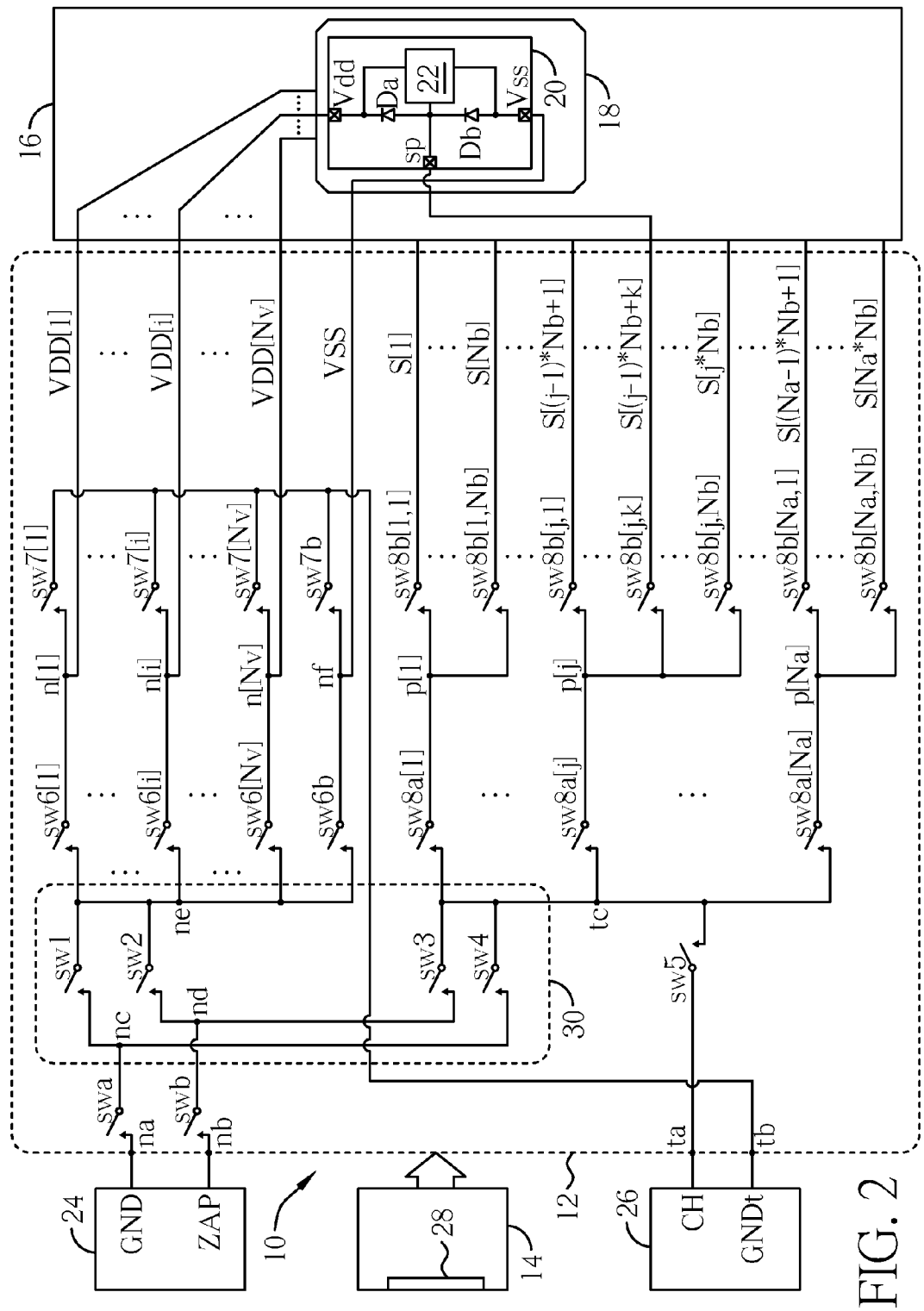
FIG. 2 illustrates an electronic test system according to an embodiment of the invention.

Please refer to FIG. 2 illustrating an electronic test system 10 according to an embodiment of the invention, which not only performs EOS tests of various scenarios, but also performs self-checks before and after tests. The electronic test system 10 performs tests for the chip 20 in cooperation with the signal generator 24 and a tester 26, and includes a switch array 12, a switch control circuit 14, a circuit board 16 and a socket 18. The switch array 12 includes a switch circuit 30, switches swa and swb (a source switch and a second source switch), a switch sw5 (a fifth switch), a number Nv of switches sw6[1] to sw6[Nv] and a switch sw6b (as sixth switches), a number Nv of switches sw7[1] to sw7[Nv] and a switch sw7b (as seventh switches), a number Na of switches sw8a[1] to sw8a[Na] and a number Na*Nb of switches sw8b[1,1] to sw8b[Na,Nb] (as eighth switches); the switch circuit 30 includes switches sw1 to sw4 (a first to a fourth switches).

Each switch of the switch array 12 can be a relay or other kind of circuit or element which can be controlled to selectively conduct or not to conduct, and the switch control circuit 14 is coupled to these switches (with coupling relations not shown in FIG. 2). The switch control circuit 14 receives procedure control commands of automatic test through an interface 28, and accordingly controls (drives) each switch in the switch array 12, such that each of the switches can independently conduct or stop conducting.

In the switch array 12, the switch swa is coupled between nodes na and nc for selectively conducting between the nodes na and nc; the node na can be considered as a signal source terminal coupled to the signal terminal GND of the signal generator 24. Similarly, the switch swb is coupled between nodes nb and nd, and the node nb can be regarded as a second signal source terminal for coupling another signal terminal ZAP of the signal generator 24.

A terminal of the switch sw1 and a terminal of the switch sw4, respectively as a first front terminal and a fourth front terminal, are commonly coupled to the node nc; the other terminals of the switch sw1 and the switch sw4 (a first back terminal and a fourth back terminal) are respectively coupled to nodes ne and tc; accordingly, the switch sw1 controls conduction between the nodes nc and ne, and the switch sw4 controls conduction between the nodes nc and tc. Similarly, a terminal of the switch sw2 and a terminal of the switch sw3, respectively as a second front terminal and a third front terminal, are commonly coupled to the node nd; the other terminal of the switch sw2 and the other terminal of the switch sw3 (a second back terminal and a third back terminal) are respectively coupled to the nodes ne and tc; the switch sw2 therefore controls conduction between the nodes nd and ne, and the switch sw3 controls conduction between the nodes nd and tc.

The switch sw5 is coupled between nodes ta and tc for selectively conducting between the nodes ta and tc; nodes ta and tb can be regarded as a first signal source terminal and a second signal source terminal respectively coupled to a channel terminal CH and a tester ground terminal GNDt of the tester 26.

In the switch array 12, the quantity Nv of the switches sw6[1] to sw6[Nv] (and the switches sw7[1] to sw7[Nv]) can be greater than or equal to 1; each switch sw6[i] associates with a switch sw7[i] for i=1 to Nv. The switch sw6[i] is coupled between nodes ne and n[i] for selectively conducting between the nodes ne and n[i]; the switch sw7[i] is coupled between the nodes n[i] and tb for controlling conduction between the nodes n[i] and tb. The switch sw6b associates with the switch sw7b; the switch sw6b is coupled between nodes ne and nf for selectively conducting between these two nodes, and the switch sw7b is coupled between the nodes nf and tb for selectively conducting between the nodes nf and tb. Every two of the nodes n[1] to n[Nv] and nf are mutually isolated, and the nodes n[1] to n[Nv] and nf respectively extend as connection terminals VDD[1] to VDD[Nv] and VSS (first connection terminals). The connection terminals VDD[1] to VDD[Nv] are respectively coupled to power pins of the chip 20 via routings of the circuit board 16 and the socket 18; for example, a given connection terminal VDD[i] is coupled to the pin Vdd of the chip 20. Similarly, the connection terminal VSS is coupled to ground pin(s) of the chip 20, such as the pin Vss, by routings of the circuit board 16 and the socket 18.

In the switch array 12, the quantity Na of the switches sw8a[1] to sw8a[Na] can be greater than or equal to 1, each switch sw8a[j] (for j=1 to Na) is coupled between nodes tc and p[j] for selectively conducting between the nodes tc and p[j]; every two of the nodes p[1] to p[Na] are mutually isolated. Each switch sw8a[j] can associate with one or more switches sw8b[j,k]; in the embodiment of FIG. 2, each switch sw8a[j] associates with a number Nb of switches sw8b[j,1] to sw8b[j,Nb]. Each switch sw8b[j,k] has a terminal coupled to the node p[j] and an other terminal extending as a connection terminal S[(j−1)*Nb+k] for j=1 to Na, k=1 to Nb; each switch sw8b[j,k] controls conduction between the node p[j] and the connection terminal S[(j−1)*Nb+k]. Accordingly, the Na switches sw8a[1] to sw8a[Na] and the Na*Nb switches sw8b[1,1] to sw8b[Na,Nb] associate with Na*Nb connection terminals (second connection terminals) S[1] to S[Na*Nb]. Each connection terminal S[(j−1)*Nb+k] is coupled to a signal pin, e.g., the pin sp, of the chip 20 by routings of the circuit board 16 and the socket 18. In another embodiment, the switches sw8b[j,k] are omitted, and the node p[j] of the switch sw8a[j] is directly utilized as a connection terminal, so the Na switches sw8a[1] to sw8a[Na] associate with Na connection terminals S[1] to S[Na].

In an embodiment of the invention, the number Nv can be 10 to provide 10 connection terminals VDD[1] to VDD[10] respectively coupled to 10 power pins of the chip 20. The quantity Na can equal 4, and the quantity Nb can be 64, so as to provide 256 connection terminals S[1] to S[256] for coupling signal pins of the chip 20.

Figure 3:
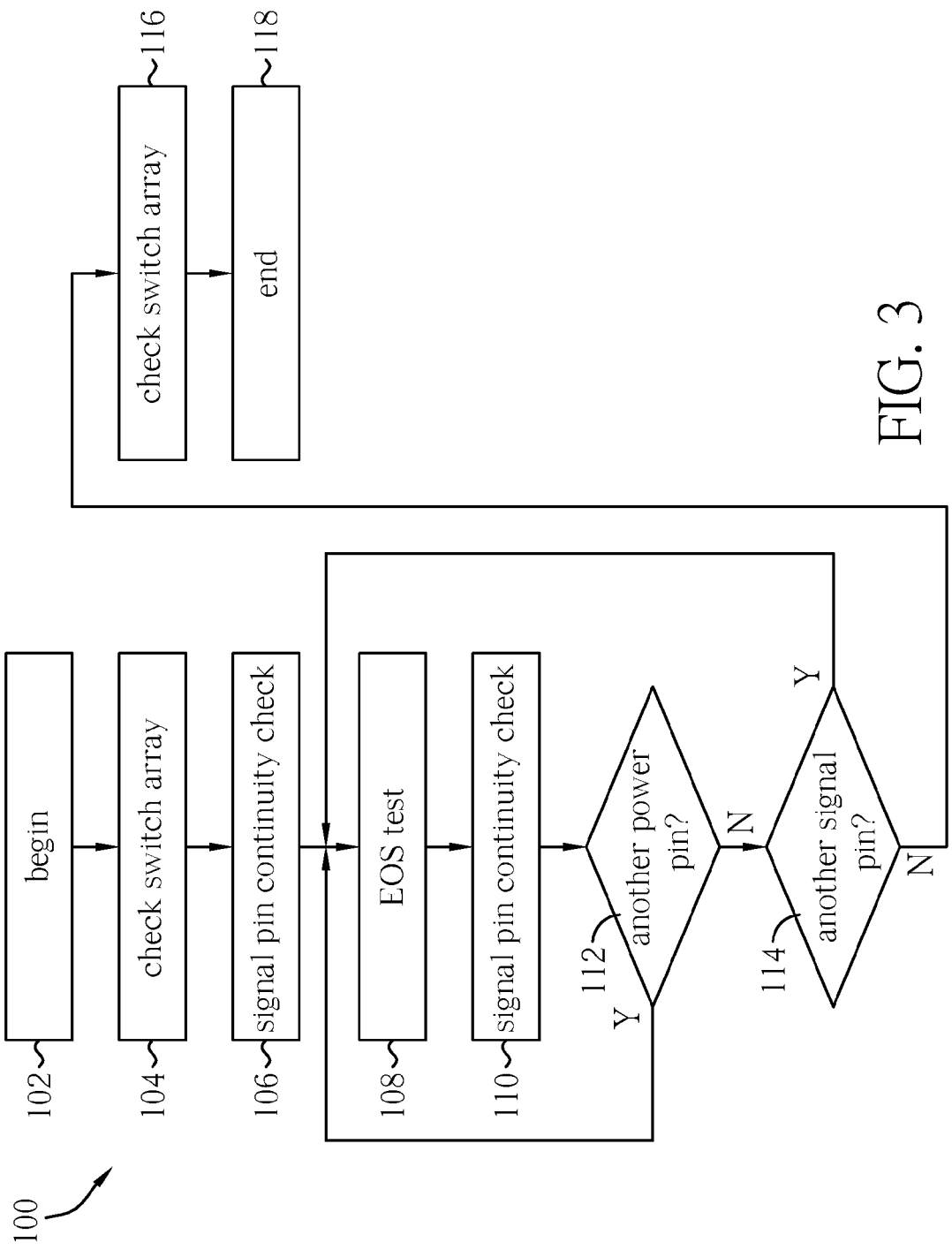
FIG. 3 illustrates a flow for performing EOS test by the electronic test system in FIG. 2 according to an embodiment of the invention.

Please refer to FIG. 3 illustrating a flow 100 for performing EOS test according to an embodiment of the invention. The flow 100 applies to the electronic test system 10 of FIG. 2 for testing the chip 20. Main steps of the flow 100 are described as follows:

Step 102: start the flow 100.

Step 104: check frequently used switches of the switch array 12, e.g., the switches sw1 to sw4, sw6[1] to sw6[Nv], sw6b, sw7[1] to sw7[Nv] and sw7b. In following steps of the flow 100, these switches frequently alternate between conducting and not conducting, so whether they can normally function can be checked in this step. Flows for performing the step 104 with the electronic test system 10 will be explained later by, e.g., FIG. 4 to FIG. 9. After the switches are confirmed to function normally, the flow 100 can proceed to the next step 106.

Step 106: for the signal pins of the chip 20 which are targets of EOS test, perform continuity check for these testing pins, and record the result to a data log. The electronic test system 10 can automatically perform the continuity check with flows later detailed by, e.g., FIG. 10 to FIG. 13. The number of testing signal pins can be less than the number of all signal pins of the chip under test; in other words, some of the signal pins do not need to be tested.

Step 108: perform EOS test for a given testing signal pin of the chip 20 by applying EOS test waveform between the given testing signal pin and a ground pin and/or a power pin, such as the scenarios 32a, 32b, 34a and/or 34d shown in FIG. 1. For a same chip, the EOS test can be performed for only one or less than four of all the four scenarios; i.e., it is not necessary to perform EOS test of all four scenarios for a chip. In an embodiment, four chips are selected as under-test chips from a same kind/batch of chips, and the flow 100 is applied to each of the under-test chips; each under-test chip is tested with only one scenario, but different under-test chips are tested with different scenarios. The electronic test system 10 automatically performs these EOS tests with flows explained later in, e.g., FIG. 14 to FIG. 21.

Step 110: for all tested signal pins, check their continuity again, and record the result to the data log for a comparison with the result of the step 106; according to the comparison result, whether the under-test chip is damaged by EOS can be revealed.

Step 112: because the scenarios 34a and 34b are designed for a single power pin, if the test of the step 108 includes the scenarios 34a and/or 34b, the steps 108 and 110 can repeat for each of different testing power pins. If there is no other power pin left to be tested, the flow 100 proceeds to the next step 114.

Step 114: because the step 108 is performed on a single signal pin, the steps 108 and 110 can repeat for each of testing signal pins; if all testing signal pins have been tested by the step 108 and there is no other testing signal pins left to be tested, the flow 100 proceeds to the step 116.

Step 116: the same as the step 104, check the switch array again.

Step 118: end the flow 100.

Figure 4:
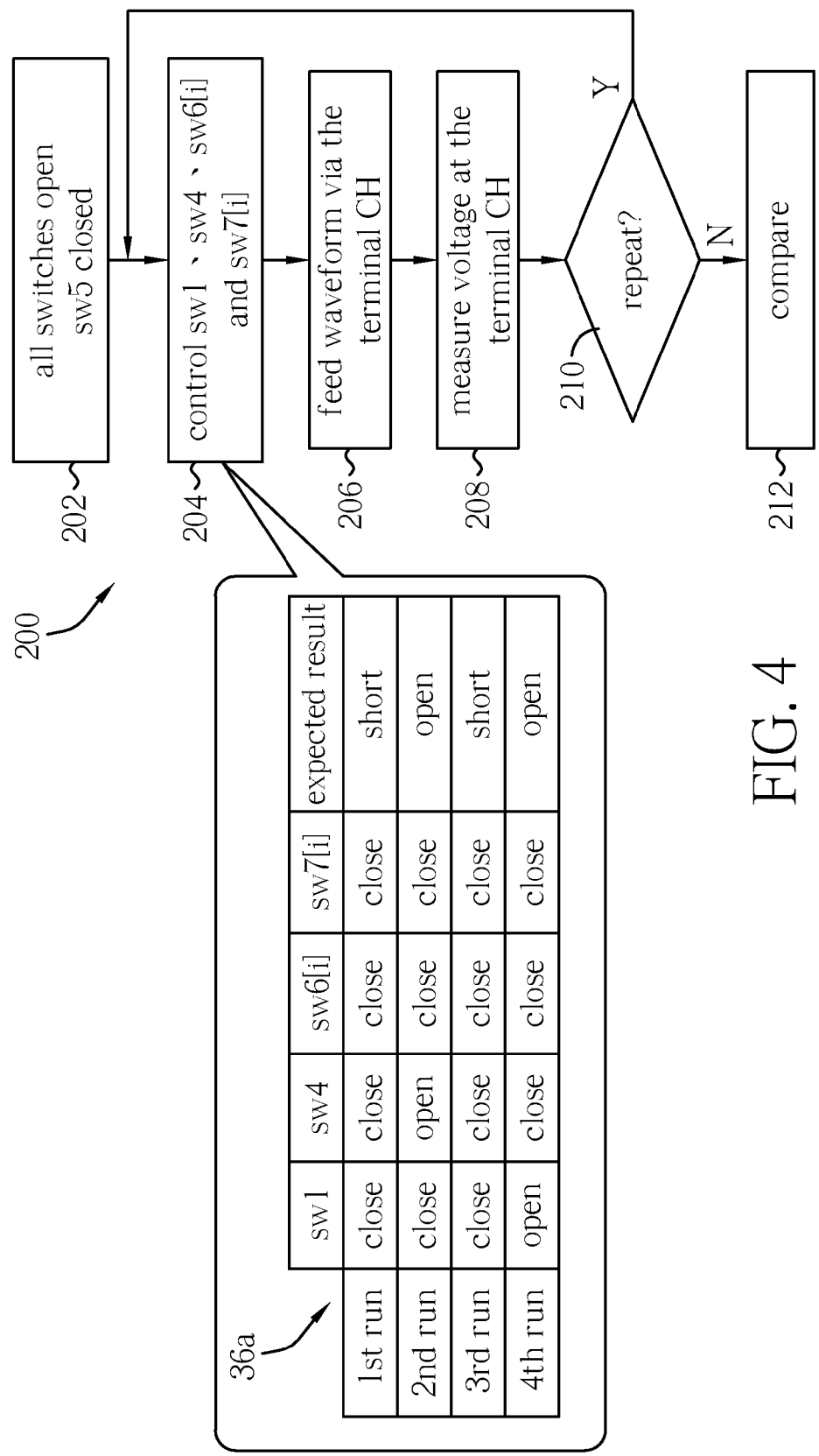
FIG. 4 illustrates a flow for checking the switch array in FIG. 2 according to an embodiment of the invention.
Figure 5:
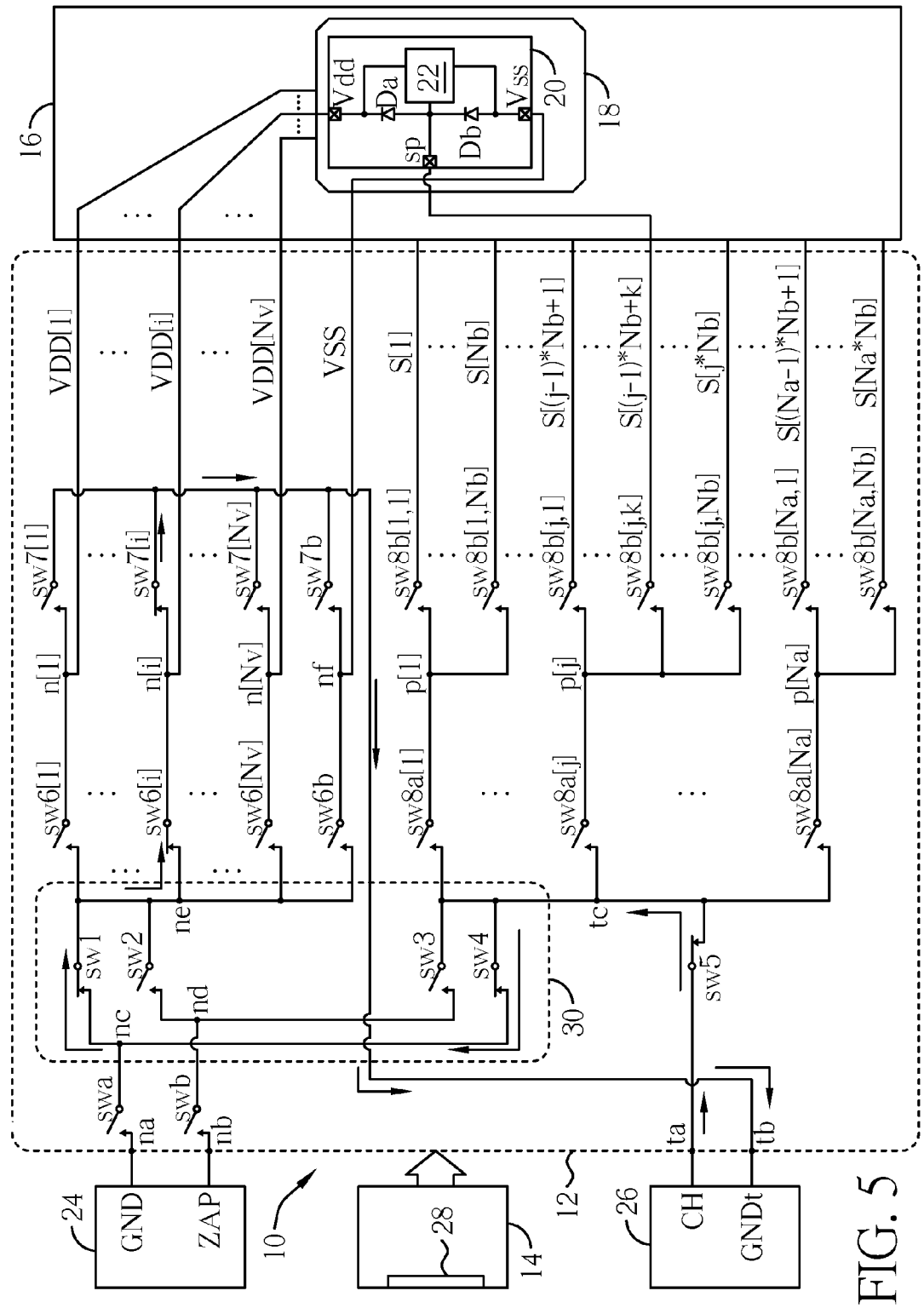
FIG. 5 illustrates execution of the flow in FIG. 4 by the electronic test system shown in FIG. 2.

Following description of FIG. 3, please refer to FIG. 4 and FIG. 5. FIG. 4 illustrates a flow 200 which is one of the flows arranged to check the switch array 12 according to an embodiment of the invention; during the steps 104 and 116 (FIG. 3), the electronic test system 10 can check the switches sw1 and sw4 according to the flow 200. FIG. 5 illustrates process of the flow 200. Main steps of the flow 200 can be described as follows.

Step 202: control the switch array 12 such that all the switches in the switch array 12 are open (not conducting), including the switches swa, swb, sw1 to sw5, sw6[1] to sw6[Nv] and sw6b, sw7[1] to sw7[Nv] and sw7b, sw8a[1] to sw8a[Na] and sw8b[1,1] to sw8b[Na,Nb]. Then, control the switch sw5 to be closed (to conduct).

Step 204: control the switches sw1, sw4, sw6[i] and sw7[i]. The step 204 and the following steps 206 and 208 can repeat for four times; during each repeat, the switches sw1, sw4, sw6[i] and sw7[i] are controlled according to a table 36a. For example, for the first run of the step 204, the switches sw1, sw4, sw6[i] and sw7[i] are closed (conducting); for the second run of the step 204, the switch sw4 is controlled to be open (not conducting). During the third run of the step 204, the switch sw4 is again controlled to be closed; for the fourth run of the step 204, the closed switch sw1 changes to be open, and the switch sw4 remains closed. While closing the switch/switches sw6[i], a single switch sw6[i] is closed, or, the switches sw6[1] to sw6[Nv] (or several among them) are controlled to be closed. Similarly, for closing the switch/switches sw7[i], a single switch sw7[i] is closed, or, the switches sw7[1] to sw7[Nv] (or several among them) are controlled to be closed. Moreover, the switches sw6[i1] and sw7[i2] can be controlled to conduct with different indexes i1 and i2.

Step 206: utilize the tester 26 to feed current, e.g., a current of 1 mA (1 mA is one-thousandth of an Ampere) via the channel terminal CH.

Step 208: use the tester 26 to measure a voltage at the channel terminal CH. Each repeat of the steps 204, 206 and 208 can check whether the switches sw1 and sw4 can normally function, wherein FIG. 5 illustrates the first run of the steps 204, 206 and 208. As shown in FIG. 5, because the switch sw5 conducts, the channel terminal CH of the tester 26 is conducted from the node ta to the node tc, and the tester ground terminal GNDt is conducted from the node tb to the nodes n[i] and ne due to the closed switches sw7[i] and sw6[i]. Since the switches sw2 and sw3 are open, whether the channel terminal CH and the tester ground terminal GNDt can form a loop via the nodes tc, nc and ne is dependent on the switches sw1 and sw4. During first run of the step 204, if the switches sw1 and sw4 can be correctly controlled to be closed, electric paths from the nodes tc to nc and from the nodes nc to ne can be conducted, and then a loop of low resistance is formed between the channel terminal CH and the tester ground terminal GNDt; therefore, the voltage measured at the channel terminal CH should approach 0 Volts (be within a predetermined error around 0 Volts) and nearly short. The expected result shown in the table 36a hence means what should be measured at the channel terminal CH if the switches sw1 and sw4 can be correctly controlled. For the first run of the step 204, if the voltage measured at the channel terminal CH does not approach 0 Volts, the switch/switches sw1 and/or sw4 may already fail to function normally. Similarly, for the second run of the step 204, since the switch sw4 is controlled to be open and then interrupt conduction between the nodes tc and nc, there should be no low-resistance loop between the channel terminal CH and the tester ground terminal GNDt, and thus the expected voltage measurement result at the channel terminal CH should be open (i.e., the measured voltage does not approach 0 Volts.)

Step 210: if the steps 204, 206 and 208 have not been repeated for four times, return to the step 204; if all switch setting arrangements listed in the table 36a have been accomplished, proceed to the step 212.

Step 212: compare whether the practical measured result of each repeat (run) matches the expected result shown in the table 36a; if true, the switches sw1 and sw4 are checked for correct functioning, i.e., the switches sw1 and sw4 can be correctly controlled to alternate between being open and closed.

Figure 6:
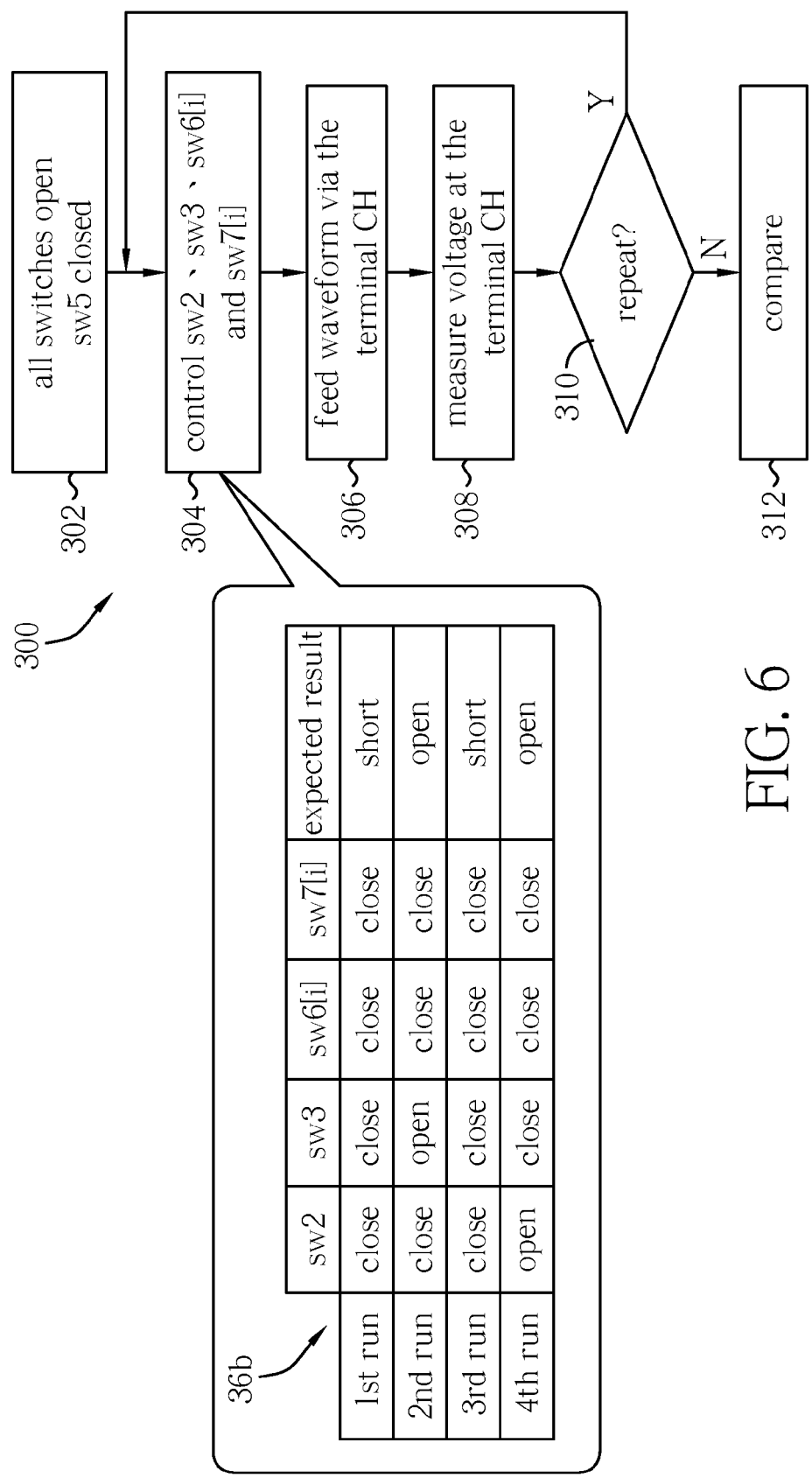
FIG. 6 illustrates a flow for checking the switch array in FIG. 2 according to an embodiment of the invention.
Figure 7:
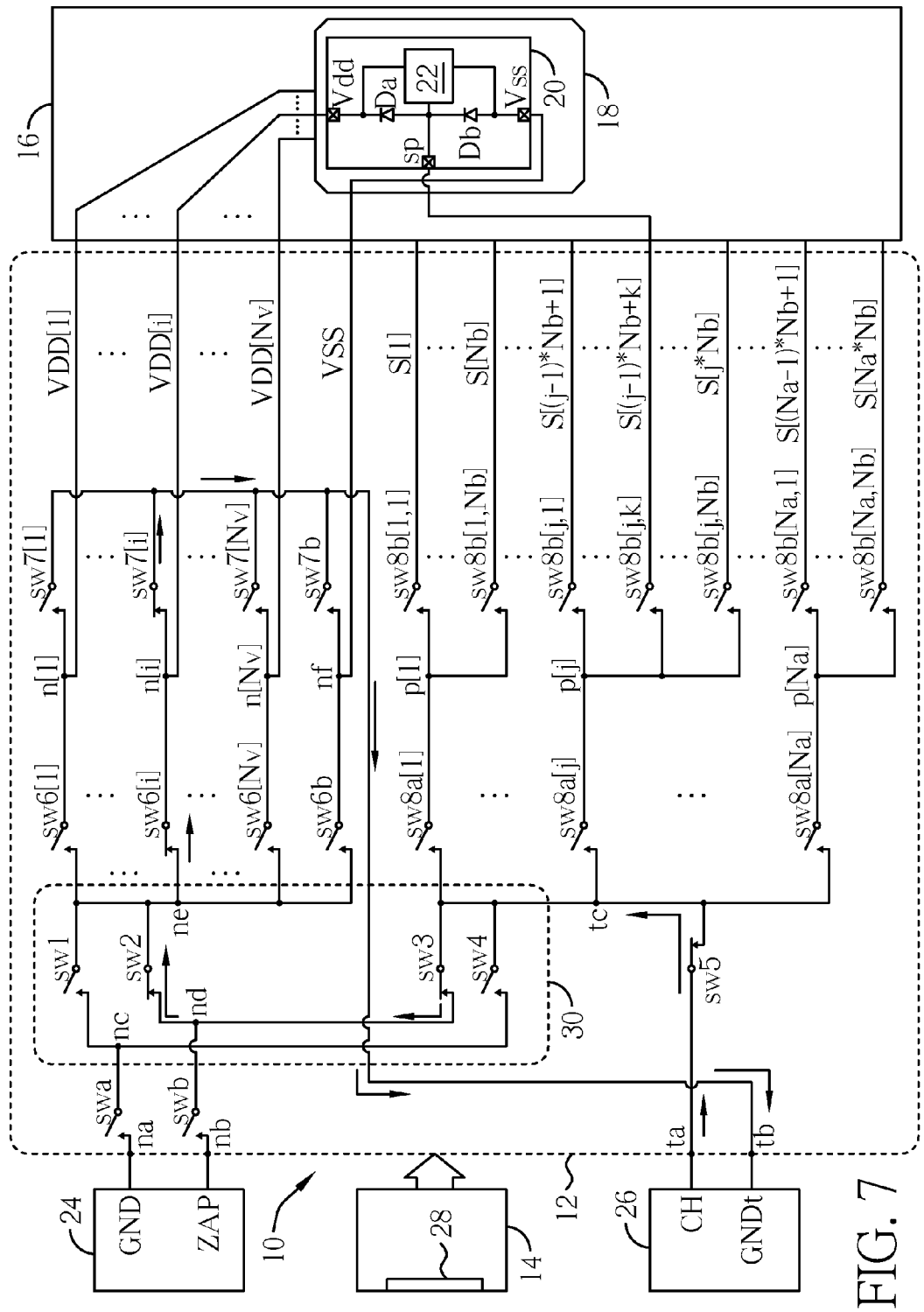
FIG. 7 illustrates execution of the flow in FIG. 6 by the electronic test system shown in FIG. 2.

Following description of FIG. 3, please refer to FIG. 6 and FIG. 7; FIG. 6 illustrates a flow 300 which is one of the flows for checking the switch array 12 according to an embodiment of the invention; during the steps 104 and 116 (FIG. 3), the electronic test system 10 checks the switches sw2 and sw3 by applying the flow 300. FIG. 7 depicts process of the flow 300. Philosophy and process of the flow 300 can be derived from the flow 200; main steps of the flow 300 can be described as follows.

Step 302: first control all switches of the switch array 12 to be open, and then control the switch sw5 to be closed.

Step 304: control the switches sw2, sw3, sw6[i] and sw7[i]. The step 304 and the following steps 306, 308 can repeat four times, and the switches sw2, sw3, sw6[i] and sw7[i] are controlled according to the table 36b for each repeat. That is, for the first run of the step 304, the switches sw2, sw3, sw6[i] and sw7[i] are closed; for the second run of the step 304, the switch sw3 changes to be open. For the third run of the step 304, the switch sw3 is again closed; for the fourth run of the step 304, the closed switch sw2 changes to be open, and the switch sw3 is kept closed.

Step 306: utilize the tester 26 to feed a current via the channel terminal CH, e.g., a current of 1 mA.

Step 308: use the tester 26 to measure voltage at the channel terminal CH. Each run of the steps 304, 306 and 308 checks whether the switches sw2 and sw3 can correctly function, and the first run of the steps 304, 306 and 308 is shown in FIG. 7. The channel terminal CH is conducted from the nodes ta to tc by the closed switch sw5, and the tester ground terminal GNDt is conducted from the nodes tb to ne due to closed switches sw7[i] and sw6[i]. Because the switches sw1 and sw4 remains open, whether a loop can be formed from the channel terminal CH to the tester ground terminal GNDt via the nodes tc, nd and ne will be determined by the switches sw2 and sw3. For example, during the first run of the step 304, if the switches sw2 and sw3 are controlled to correctly closed, electric paths between from the nodes tc to nd and from the nodes nd to ne are conducted, and thus a low-resistance loop can be formed between the channel terminal CH and the tester ground terminal GNDt, such that the voltage measured at the channel terminal CH will approach 0 Volts. The table 36b also lists expected results of measurement.

Step 310: if the steps 304, 306 and 308 have not been repeated for four times, return to the step 304; if all the switch setting arrangements listed in the table 36b are checked, proceed to the step 312.

Step 312: compare whether the measured result of each run matches associated expected result listed in the table 36b; if true, the switches sw2 and sw3 are checked to function correctly.

Figure 8:
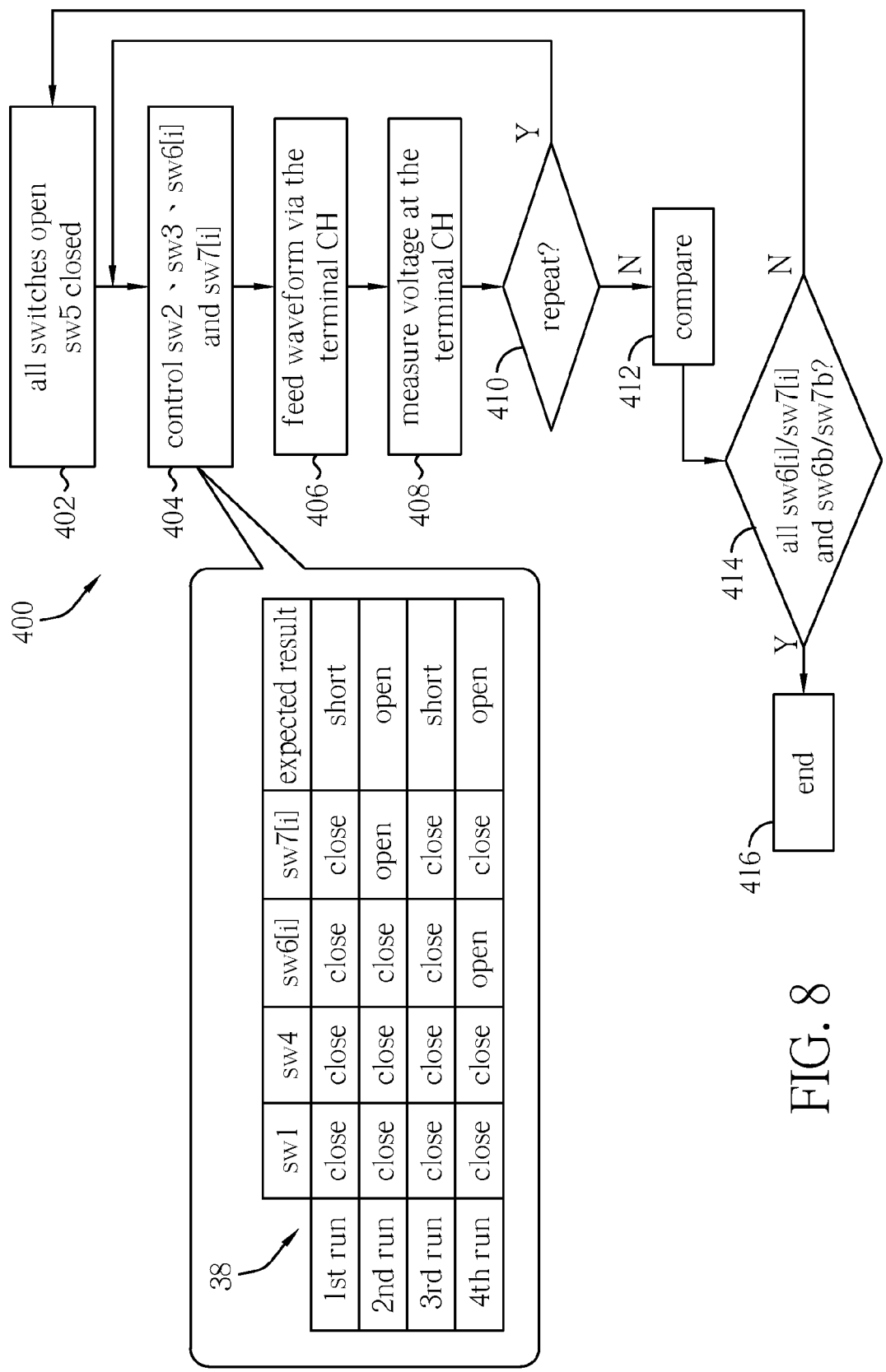
FIG. 8 illustrates a flow for checking the switch array in FIG. 2 according to an embodiment of the invention.
Figure 9:
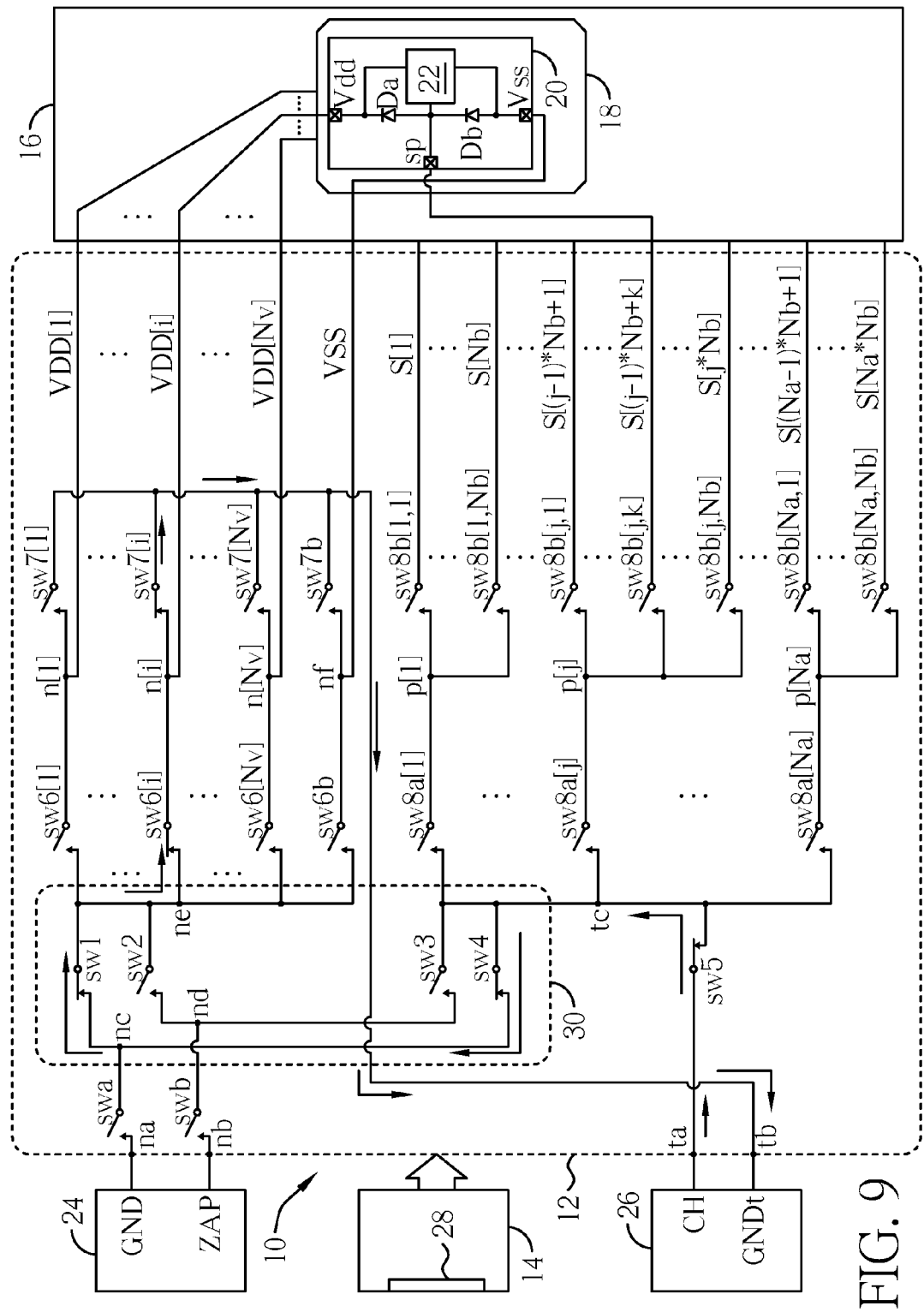
FIG. 9 illustrates execution of the flow in FIG. 8 by the electronic test system shown in FIG. 2.

Following FIG. 3, please refer to FIG. 8 and FIG. 9; FIG. 8 illustrates a flow 400 which is one of the flows for checking the switch array 12 according to an embodiment of the invention; during the steps 104 and 116, the electronic test system 10 can follow the flow 400 to check the switches sw6[i] and sw7[i] associated with a connection terminal VDD[i], and check the switches sw6b and sw7b associated with the connection terminal VSS. FIG. 9 illustrates process of the flow 400. Main steps of the flow 400 can be described as follows.

Step 402: first control all switches of the switch array 12 to be open, and then control the switch sw5 to be closed for conduction.

Step 404: for a given index i, control the switches sw1, sw4, sw6[i] and sw7[i]. For a same index i, the step 404 and the following steps 406 and 408 can repeat four times (runs), and the switches sw1, sw4, sw6[i] and sw7[i] are controlled according to a row of a table 38 during each repeat. That is, for a same pair of switches sw6[i]/sw7[i], the switches sw1, sw4, sw6[i] and sw7[i] are closed for the first run of the step 404; the switch sw7[i] changes to be open during the second run of the step 404. For the third run of the step 404, the switch sw7[i] again changes to be closed; for the fourth run of the step 404, the closed switch sw6[i] changes to be open, and the switch sw7[i] remains to be closed.

Step 406: feed current, e.g., a current of 1 mA, via the channel terminal CH by the tester 26.

Step 408: measure voltage at the channel terminal CH by the tester 26. Each run of the steps 404, 406 and 408 checks if a pair of switches sw6[i] and sw7[i] can correctly operate, and FIG. 9 illustrates the first run of the steps 404, 406 and 408. By the closed switches sw5, sw4 and sw1, the channel terminal CH of the tester 26 is conducted from the nodes ta to tc, from the nodes tc to nc, and from the nodes nc to ne. Hence, whether a loop can be formed between the channel terminal CH and the tester ground terminal GNDt via the node n[i] is determined by the switches sw6[i] and sw7[i]. For example, during the first run of the step 404, if the switches sw6[i] and sw7[i] are correctly controlled to be closed, electric paths from the nodes ne to n[i] and from the nodes n[i] to tb are conducted, a low-resistance loop can therefore be formed between the channel terminal CH and the tester ground terminal GNDt, and the voltage measured at the channel terminal CH will approach 0 Volts. The table 38 lists expected results for measurements.

Step 410: for a same pair of switches sw6[i]/sw7[i], if the steps 404, 406 and 408 do not repeat for four times, return to the step 404; if all switch setting arrangements listed in the table 38 for a same pair of switches sw6[i]/sw7[i] have been completed, proceed to the step 412.

Step 412: for a same pair of switches sw6[i]/sw7[i], compare if practically measured result of each run matches the associated expected result listed in the table 38; if true, the pair of switches sw6[i] and sw7[i] is checked for correct functioning.

Step 414: each run form the step 402 to the step 412 checks a pair of switches sw6[i] and sw7[i]. Since there are Nv pairs of switches sw6[i] and sw7[i] in the switch array 12, the steps 402 to 412 are repeated for each pair of switches sw6[i] and sw7[i]. After performing the steps 402 to 412 for a certain pair of switches sw6[i] and sw7[i], if there are other pairs of switches to be checked, the index i is undated and the step 402 is repeated. In addition to repeating the steps 402 to 412 for each pair of switches sw6[i] and sw7[i] among the switches sw6[1] to sw6[Nv] and sw7[1] to sw7[Nv], the steps 402 to 412 are also performed for the switches sw6b and sw7b, so as to check if the switches sw6b and sw7b can work normally. If the steps 402 to 412 have repeated for all Nv pairs of the switches sw6[i]/sw7[i] and the switches sw6b/sw7b, proceed to the step 414.

Step 414: end the flow 400.

By executing the flows 200, 300 and 400 in the step 104 (and the step 116), each of the switches sw1 to sw4, sw6[1] to sw6[Nv], sw6b, sw7[1] to sw7[Nv] and sw7b in the switch array 12 is checked.

Figure 10:
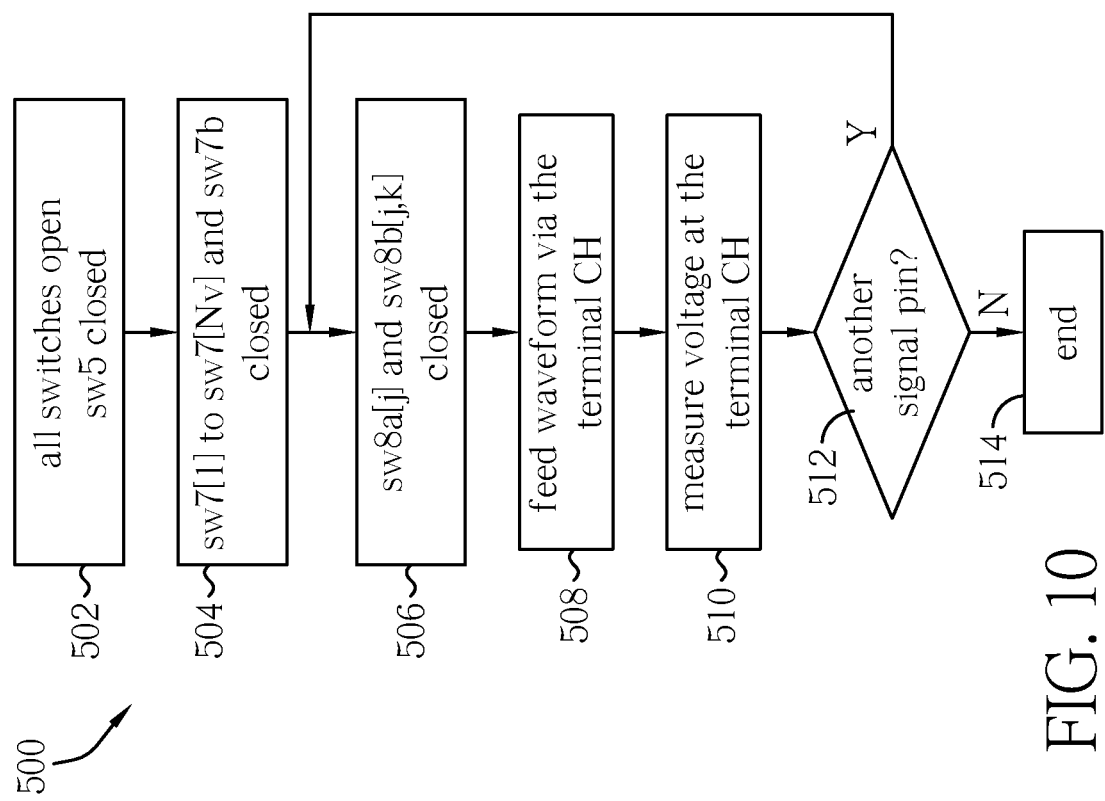
FIG. 10 illustrates a flow for a continuity check of a signal pin shown in FIG. 2 according to an embodiment of the invention.
Figure 11:
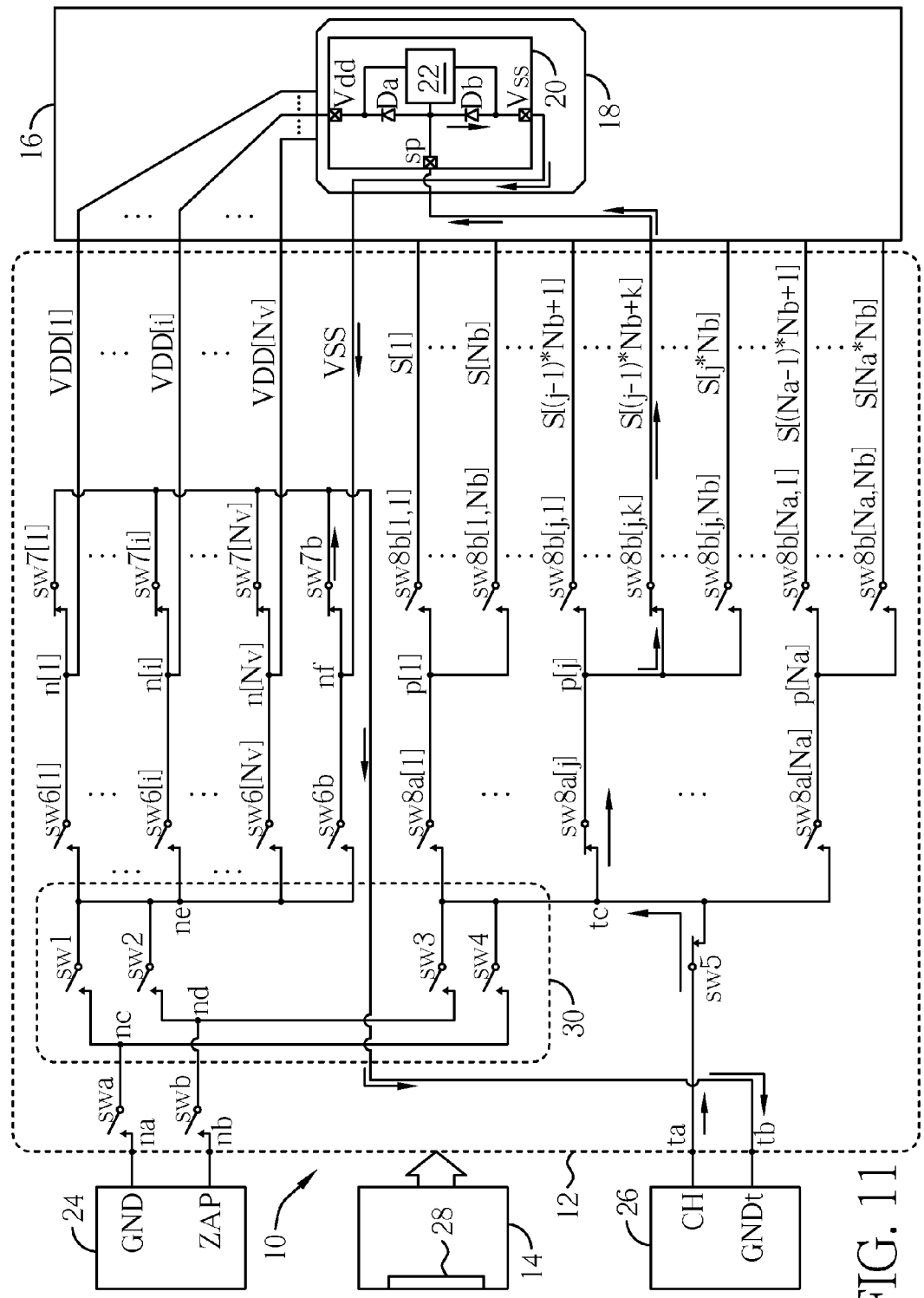
FIG. 11 illustrates execution of the flow in FIG. 10 by the electronic test system shown in FIG. 2.

Following the description of FIG. 3, please refer to FIG. 10 and FIG. 11; FIG. 10 illustrates a flow 500 as one of the flows for continuity check of each signal pin according to an embodiment of the invention; during the steps 106 and 110, the electronic test system 10 can check each signal pin of the chip 20 via the associated connection terminal, e.g., check the signal pin sp via the connection terminal S[(j−1)*Nb+k] associated with the switches sw8a[j] and sw8b[j,k], as shown in FIG. 11. Major steps of the flow 500 can be described as follows.

Step 502: control all the switches in the switch array 12 to be open, and then control the switch sw5 to be closed for conduction.

Step 504: control the switches sw7[1] to sw7[Nv] and sw7b to be closed for conduction.

Step 506: for checking the signal pin sp via the connection terminal S[(j−1)*Nb+k], control the switches sw8a[j] and sw8b[j,k], both associated with the connection terminal S[(j−1)*Nb+k], to conduct.

Step 508: use the tester 26 to feed a negative current via the channel terminal CH, e.g., a current of −0.1 mA.

Step 510: utilize the tester 26 to measure a voltage at the channel terminal CH. FIG. 11 illustrates process of the steps 506 and 508 for the connection terminal S[(j−1)*Nb+k]. The channel terminal CH of the tester 26 is conducted from the nodes ta to tc by the closed switch sw5, conducted from the nodes tc to p[j] by the closed switch sw8a[j], conducted from the node p[j] to the connection terminal S[(j−1)*Nb+k] by the closed switch sw8b[j,k], and thus conducted to the signal pin sp. In the chip 20, the negative current fed by the channel terminal CH is conducted to the ground pin Vss by the forward-biased diode Db, and hence conducted to the node nf via the connection terminal VSS; the closed switch sw7b conducts the node nf to the node tb and the tester ground terminal GNDt. With such arrangement, if the diode Db of the signal pin sp is normal, the voltage measured at the channel terminal CH should match an anode-to-cathode cross voltage of the forward-biased diode Db (i.e., be within a predetermined tolerance around the anode-to-cathode cross voltage). On the contrary, if the voltage measured at the channel terminal CH does not match the expected cross voltage of the diode Db, it means that continuity from the signal pin sp to the ground pin Vss is problematic.

Step 512: if there is another signal pin to be checked, repeat the steps 506 to 510 for that signal pin. For example, if a signal pin sp2 (not shown) is coupled to a connection terminal S[(j2−1)*Nb+k2], then the associated switches sw8a[j2] and sw8b[j2,k2] are closed in the step 506, while other switches sw8a[j] and/or sw8b[j,k] (for j=1 to Na but not j2, k=1 to Nb but not k2) are open. By feeding negative current with the channel terminal CH and comparing whether the voltage at the channel terminal CH matches the expected cross voltage of a forward-biased diode, continuity from the signal pin sp2 to the ground pin Vss can be checked. If there is no other signal pin left to be checked, proceed to the step 514.

Step 514: finish the flow 500.

Figure 12:
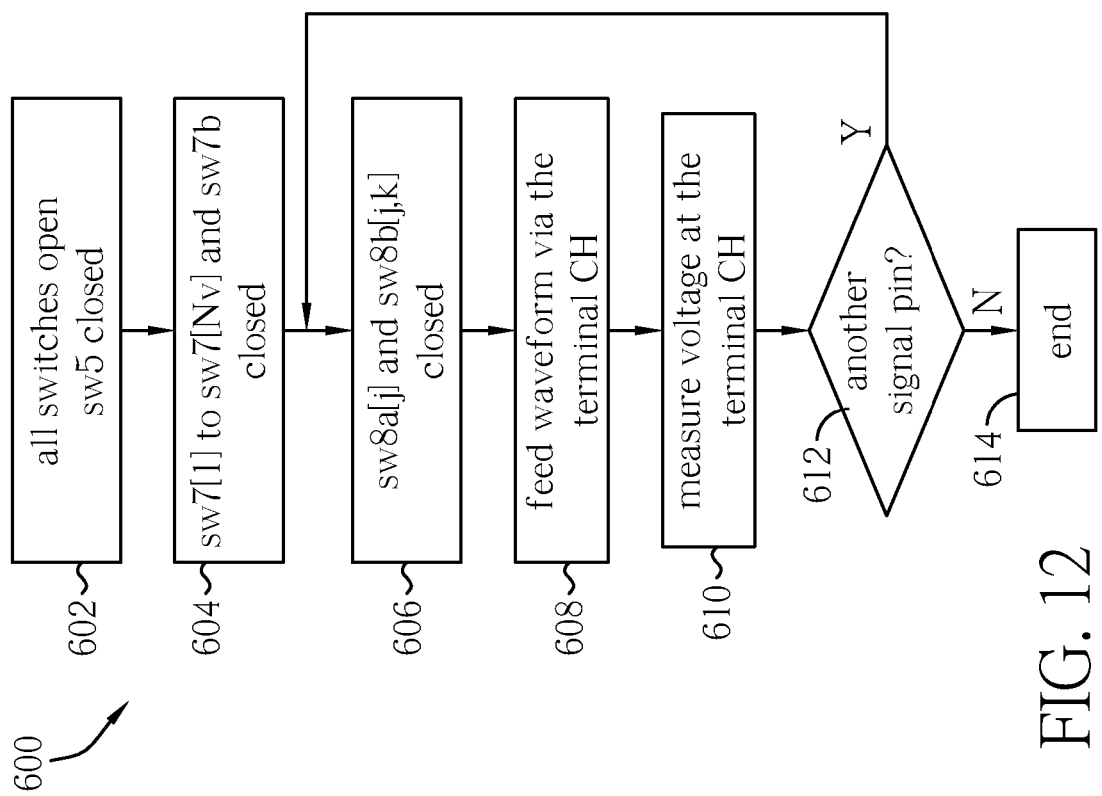
FIG. 12 illustrates a flow for a continuity check of a signal pin shown in FIG. 2 according to an embodiment of the invention.
Figure 13:
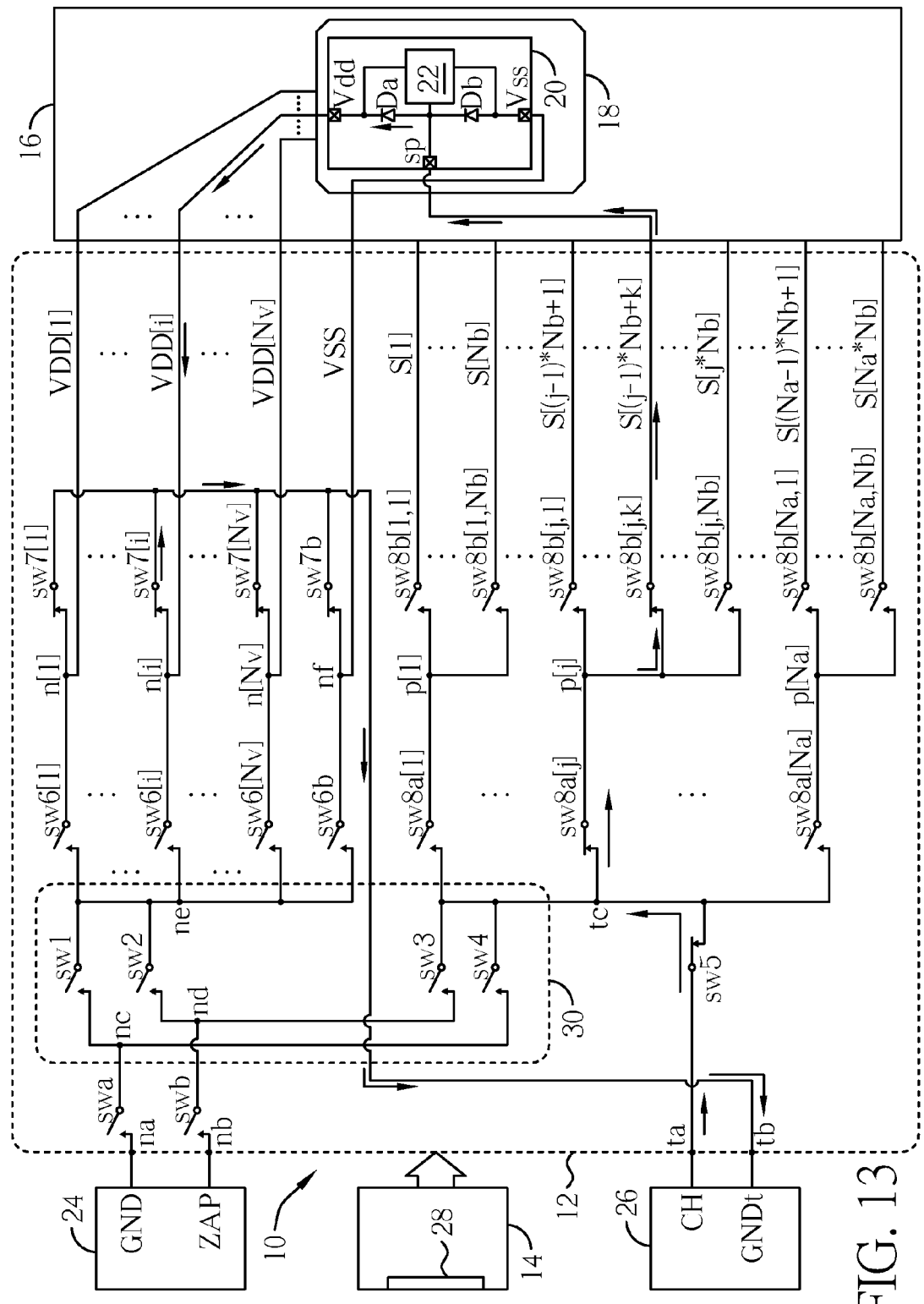
FIG. 13 illustrates execution of the flow in FIG. 12 by the electronic test system shown in FIG. 2.

The flow 500 checks signal continuity from a signal pin to an associated ground pin. By a similar flow, signal continuity from each signal pin to an associated power pin can be checked. Following the description of FIG. 3, please refer to FIG. 12 and FIG. 13; FIG. 12 illustrates a flow 600 which is one of the flows arranged for continuity check of each signal pin according to an embodiment of the invention; while executing the steps 106 and 110, the electronic test system 10 can check each signal pin of the chip 20 via an associated connection terminal, e.g., check the signal pin sp via the connection terminal S[(j−1)*Nb+k] associated with the switches sw8a[j] and sw8b[j,k], as shown in FIG. 13.

The steps 602, 604, 606, 610, 612 and 614 are respectively analogous to the steps 502, 504, 506, 510, 512 and 514; however, during the step 608, a positive current, e.g., a current of 0.1 mA, is fed by the channel terminal CH of the tester 26. For example, to check the signal pin sp coupled to the connection terminal S[(j−1)*Nb+k], the positive current fed by the channel terminal CH is conducted to the signal pin sp via the node ta, the closed switch sw5, the node tc, the closed switch sw8a[j], the node p[j], the closed switch sw8b[j,k] and the connection terminal S[(j−1)*Nb+k]. In the chip 20, the positive current fed by the channel terminal CH is conducted to the power pin Vdd by the forward-biased diode Da, and conducted to the node n[i] via the connection terminal VDD [i] associated with the power pin Vdd. The closed switch sw7[i] conducts the node n[i] to the node tb and the tester ground terminal GNDt. Therefore, if the diode Da of the signal pin sp functions correctly to maintain a proper continuity from the signal pin sp to the power pin Vdd, the voltage measured at the channel terminal CH should match the anode-to-cathode cross voltage of the forward-biased diode Da. On the other hand, if the voltage measured at the channel terminal CH does not match the expected cross voltage of the diode Da, it means that the continuity from the signal pin sp to the power pin Vdd is problematic.

Figure 14:
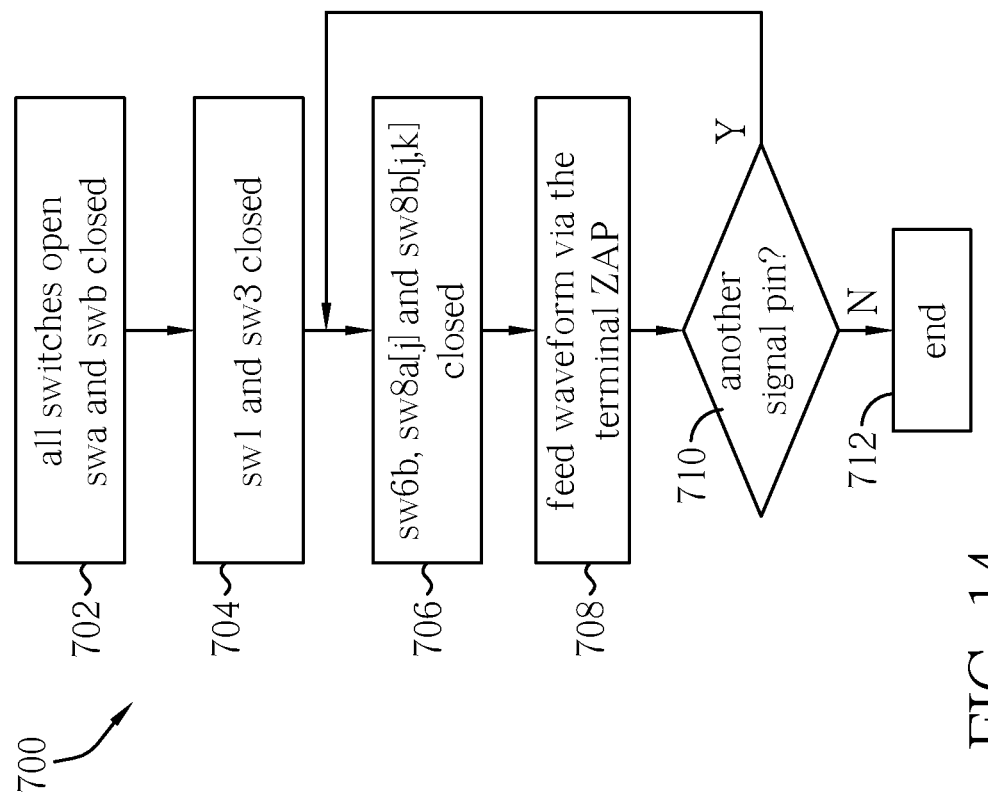
FIG. 14 illustrates a flow for an EOS test of a signal pin shown in FIG. 2 according to an embodiment of the invention.
Figure 15:
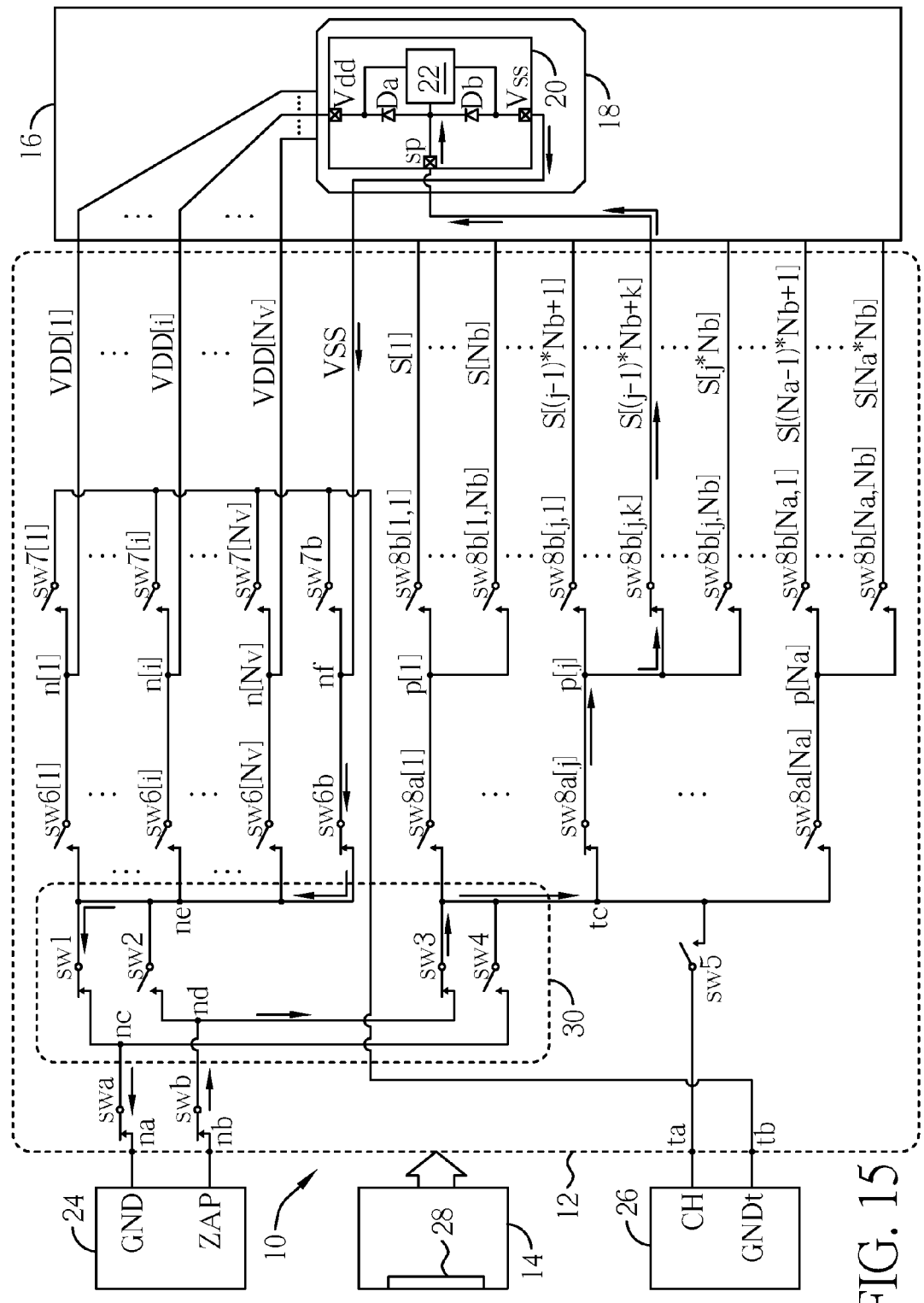
FIG. 15 illustrates execution of the flow in FIG. 14 by the electronic test system shown in FIG. 2.

Following the description of FIG. 3, please refer to FIG. 14 and FIG. 15; FIG. 14 illustrates a flow 700 as one of the flows for EOS test of each signal pin according to an embodiment of the invention; during the step 108, the electronic test system 10 can perform the EOS test of the scenario 32a (FIG. 1) for each signal pin of the chip 20 according to the flow 700, e.g., for the signal pin sp associated with the connection terminal S[(j−1)*Nb+k] via the switches sw8[j] and sw8b[j,k], as shown in FIG. 15. Main steps of the flow 700 can be described as follows.

Step 702: control the switches in the switch array 12 to be open, and then control the switches swa and swb to be closed for conduction.

Step 704: control the switches sw1 and sw3 to conduct.

Step 706: because EOS from the signal pin sp to the ground pin Vss is to be tested via the connection terminal S[(j−1)*Nb+k], the switches sw8[j] and sw8b[j,k] associated with the connection terminal S[(j−1)*Nb+k] are controlled to conduct, also the switch sw6b associated with the connection terminal VSS is controlled to conduct.

Step 708: utilize the signal generator 24 to feed the EOS test waveform between the signal terminals ZAP and GND. FIG. 15 illustrates process of the steps 706 and 708 via the connection terminal S[(j−1)*Nb+k]. The signal terminal ZAP of the signal generator 24 is conducted from the nodes nb to nd by the closed switch swb; the closed switch sw3 conducts the nodes nd to tc, the closed switch sw8[j] conducts the nodes tc to p[j], and the closed switch sw8b[j,k] conducts the node p[j] to the connection terminal S[(j−1)*Nb+1] and the signal pin sp. The ground pin Vss of the chip 20 is conducted to the node nf via the connection terminal VSS; as the switches sw6b, sw1 and swa conduct between the nodes nf, ne, nc and na, the EOS waveform between the signal terminals ZAP and GND is hence applied from the signal pin sp to the ground pin Vss, as shown in the scenario 32a.

Step 710: if there is another signal pin to be tested, then repeat the steps 706 to 708 for the signal pin. For example, if a signal pin sp2 (not shown) is coupled to the connection terminal S[(j2−1)*Nb+k2], the associated switches sw8a[j2] and sw8b[j2,k2] are closed in the step 706, and other switches sw8[j] and/or sw8b[j,k] are open (for j=1 to Na but not j2, k=1 to Nb but not k2), and the switch sw6b is closed. With such arrangement, EOS from the signal pin sp2 to the ground pin Vss can be tested. If there is no other signal pin to be tested, proceed to the step 712.

Step 712: end the flow 700.

Figure 16:
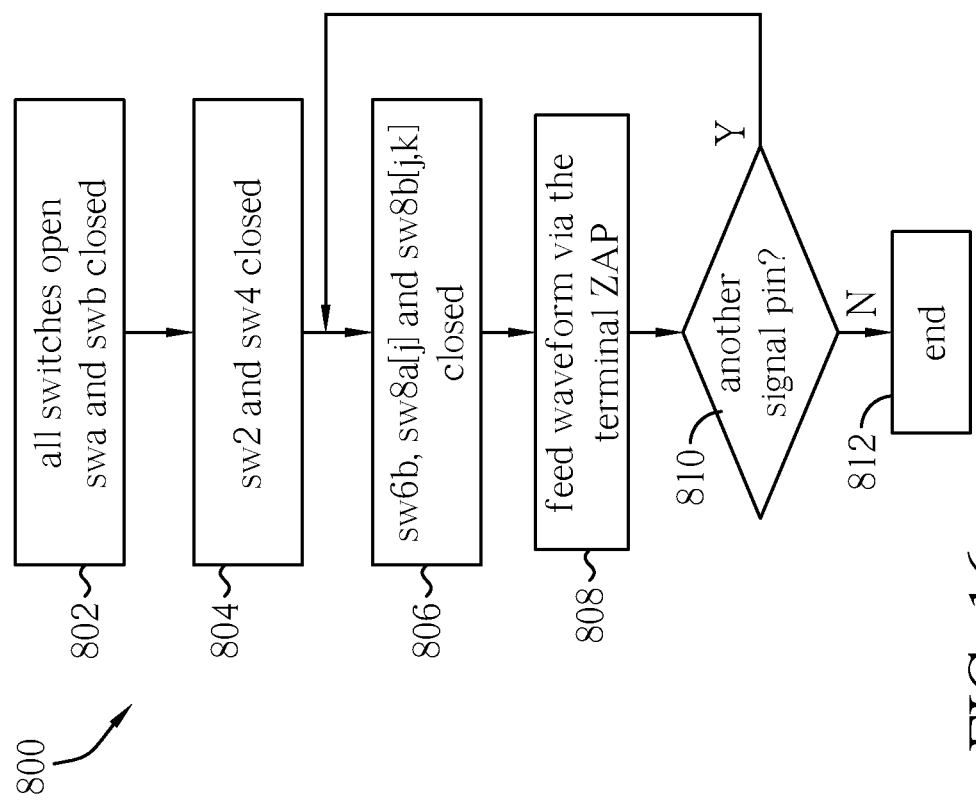
FIG. 16 illustrates a flow for an EOS test of a signal pin shown in FIG. 2 according to an embodiment of the invention.
Figure 17:
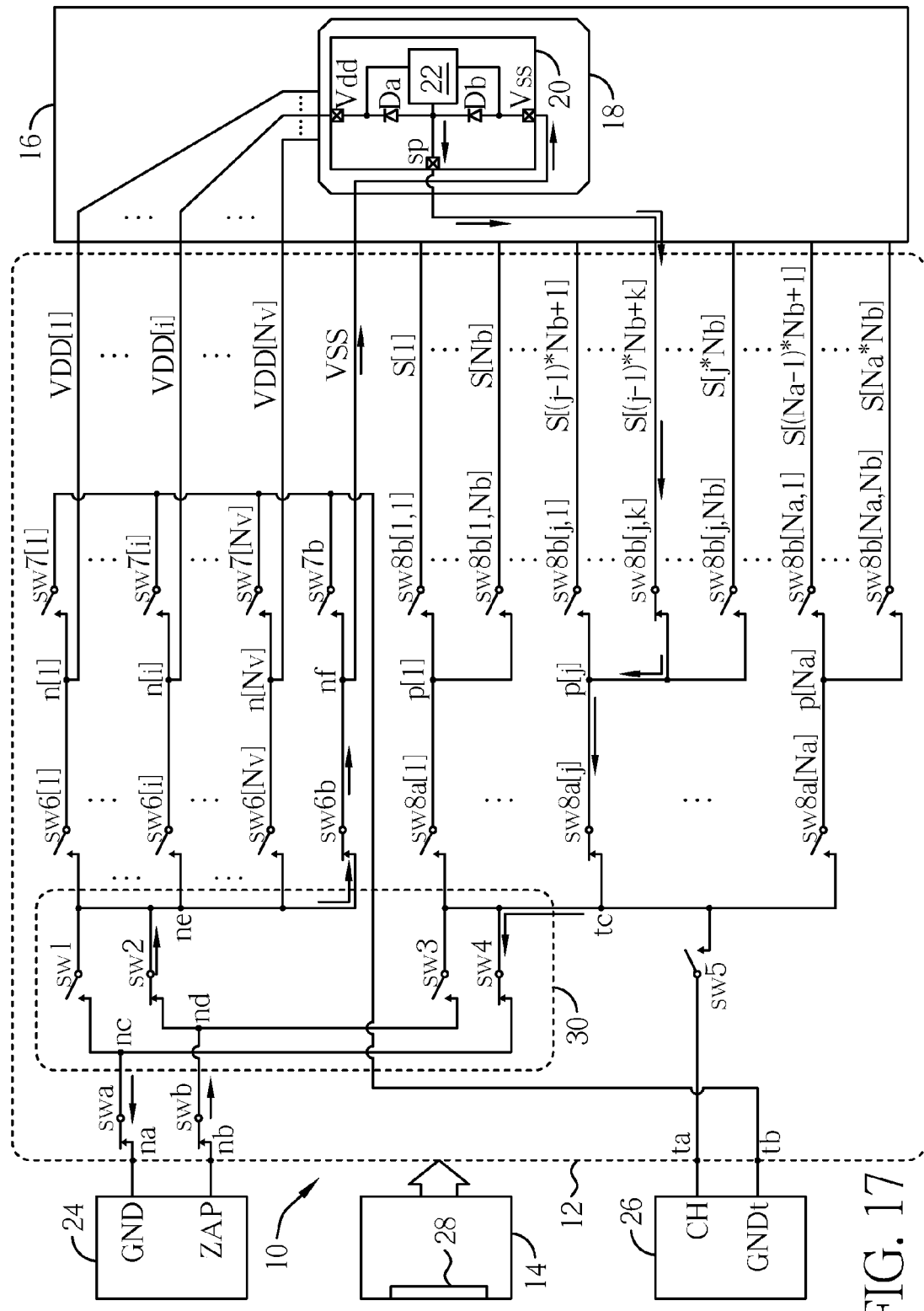
FIG. 17 illustrates execution of the flow in FIG. 16 by the electronic test system shown in FIG. 2.

Following the description of FIG. 3, please refer to FIG. 16 and FIG. 17; FIG. 16 illustrates a flow 800 which is one of the flows for EOS test of signal pin according to an embodiment of the invention; during the step 108, the electronic test system 10 can perform the EOS test of the scenario 32b (FIG. 1) for each signal pin of the chip 20 by executing the flow 800, e.g., for the signal pin sp associated with the connection terminal S[(j−1)*Nb+k] via the switches sw8[j] and sw8b[j, k], as shown in FIG. 17. Main steps of the flow 800 can be described as follows.

Step 802: control all the switches in the switch array 12 to be open, and then control the switches swa and swb to conduct.

Step 804: control the switches sw2 and sw4 to conduct.

Step 806: because EOS from the ground pin Vss to the signal pin sp (the scenario 32b) is to be tested via the connection terminal S[(j−1)*Nb+k], the switches sw8a[j] and sw8b

[j,k] associated with the connection terminal S[(j−1)*Nb+k] are controlled to conduct, also the switch sw6b associated with the connection terminal VSS is controlled to conduct.

Step 808: utilize the signal generator 24 to feed the EOS test waveform via the signal terminals ZAP and GND. FIG. 17 illustrates process of the steps 806 and 808 via the connection terminal S[(j−1)*Nb+k]. The signal terminal ZAP of the signal generator 24 is conducted from the nodes nb, nd to ne by the closed switches swb and sw2; the closed switch sw6b conducts the nodes ne to nf, as well as the connection terminal VSS and the ground pin Vss. The signal pin sp of the chip 20 is conducted from the connection terminal S[(j−1)*Nb+k] to the nodes p[j] and tc by the closed switches sw8b[j,k] and sw8a[j], and the closed switches sw4 and swa conduct between the nodes tc, nc, na and the signal terminal GND. Accordingly, the EOS test waveform between the signal terminals ZAP and GND can be applied from the ground pin Vss to the signal pin sp, as shown in the scenario 32b.

Step 810: if there is another signal pin to be tested, then repeat the steps 806 to 808 for the signal pin. If there is no other signal pin to be tested, proceed to the step 812.

Step 812: end the flow 800.

Figure 18:
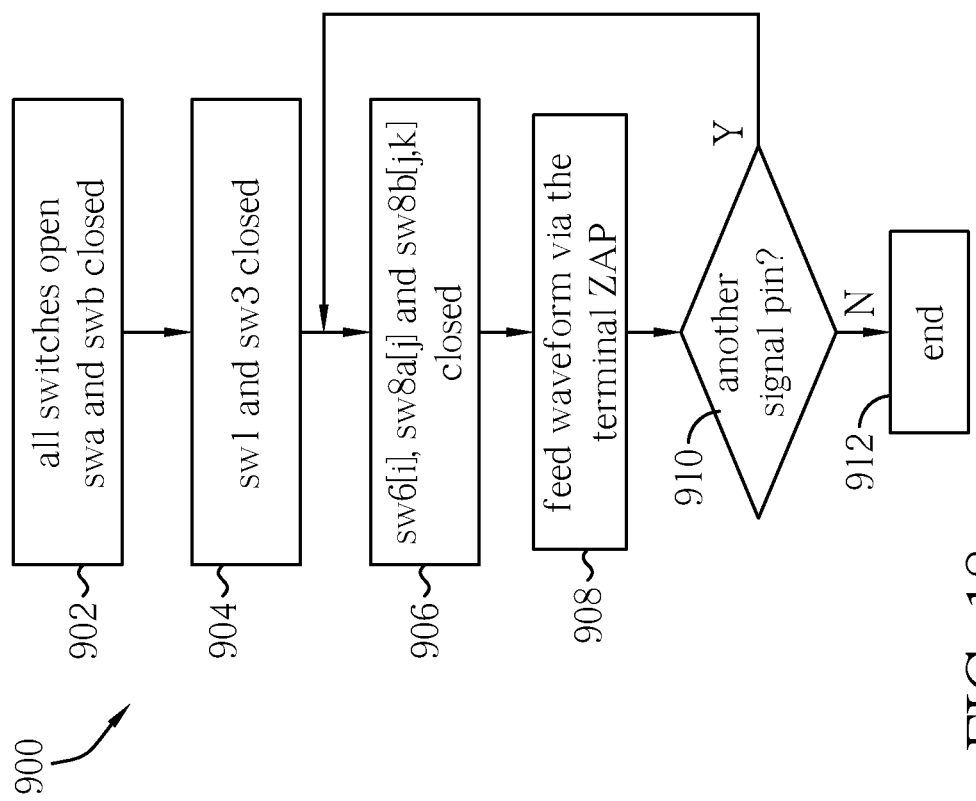
FIG. 18 illustrates a flow for an EOS check of a signal pin shown in FIG. 2 according to an embodiment of the invention.
Figure 19:
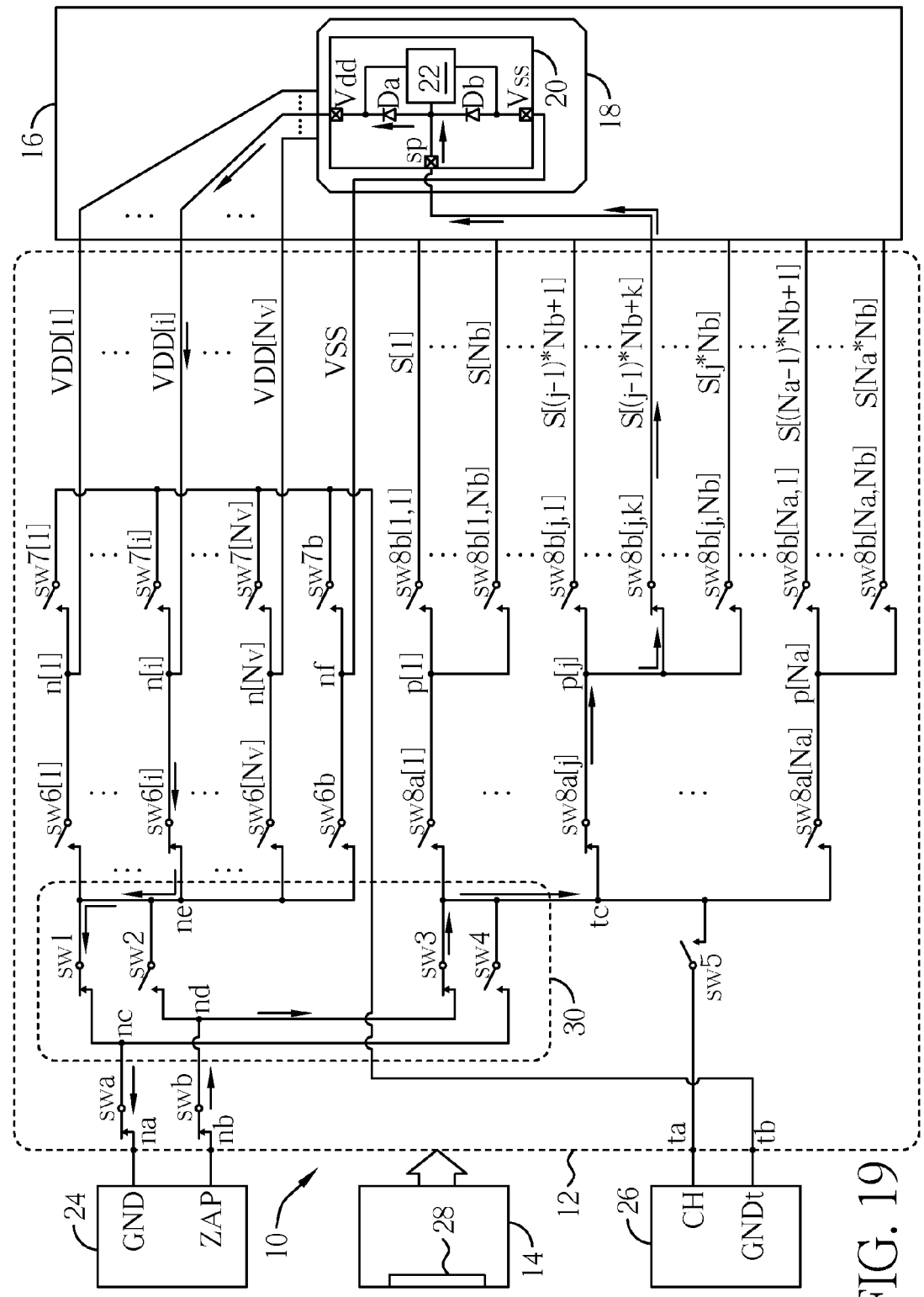
FIG. 19 illustrates execution of the flow in FIG. 18 by the electronic test system shown in FIG. 2.

Following the description of FIG. 3, please refer to FIG. 18 and FIG. 19; FIG. 18 illustrates a flow 900 which is one of the flows for EOS test of each signal pin according to an embodiment of the invention; during the step 108, the electronic test system 10 can perform the EOS test of the scenario 34a (FIG. 1) for each signal pin and each power pin of the chip 20 according to the flow 900; for example, test EOS from the signal pin sp to the power pin Vdd, as shown in FIG. 19. Main steps of the flow 900 can be described as follows.

Step 902: control all the switches in the switch array 12 to be open, and then control the switches swa and swb to be closed for conduction.

Step 904: control the switches sw1 and sw3 to be closed.

Step 906: because EOS from the signal pin sp to the power pin Vdd is to be tested, and the signal pin sp and the power pin Vdd are respectively associated with the connection terminals S[(j−1)*Nb+k] and VDD[i], the switches sw8a[j] and sw8b[j,k] associated with the connection terminal S[(j−1)*Nb+k] are controlled to conduct, also the switch sw6[i] associated with the connection terminal VDD[i] is controlled to conduct.

Step 908: utilize the signal generator 24 to feed the EOS test waveform via the signal terminals ZAP and GND. FIG. 19 illustrates process of the steps 906 and 908 via the connection terminal S[(j−1)*Nb+k] of the signal pin sp and the connection terminal VDD[i] of the power pin Vdd. The closed switches swb, sw3, sw8a[j] and sw8b[j,k] conduct the signal terminal ZAP of the signal generator 24 to the nodes nb, nd, tc and p[j], as well as the connection terminal S[(j−1)*nb+k] and the signal pin sp. The closed switches sw6[i], sw1 and swa conducts the power pin Vdd of the chip 20 to the signal terminal GND] via the connection terminal VDD[i], the nodes n[i], ne, nc and na. Thus, the EOS waveform between the signal terminals ZAP and GND can be applied from the signal pin sp to the power pin Vdd, as shown in the scenario 34a.

Step 910: if there are another signal pin and another power pin to be tested, then repeat the steps 906 to 908 for the signal pin and the power pin. For example, if a signal pin sp2 (not shown) is coupled to the connection terminal S[(j2−1)*Nb+k2] and its associated power pin (not shown) is coupled to the connection terminal VDD[i2], the associated switches sw6[i2], sw8a[j2] and sw8b[j2,k2] are closed in the step 906, and other switches sw6[i], sw8a[j] and sw8b[j,k] are open (for i=1 to Nv but not i2, j=1 to Na but not j2, k=1 to Nb but not k2), also the switch sw6b is open. If there is no other signal/power pins to be tested, proceed to the step 912.

Step 912: end the flow 900.

Figure 20:
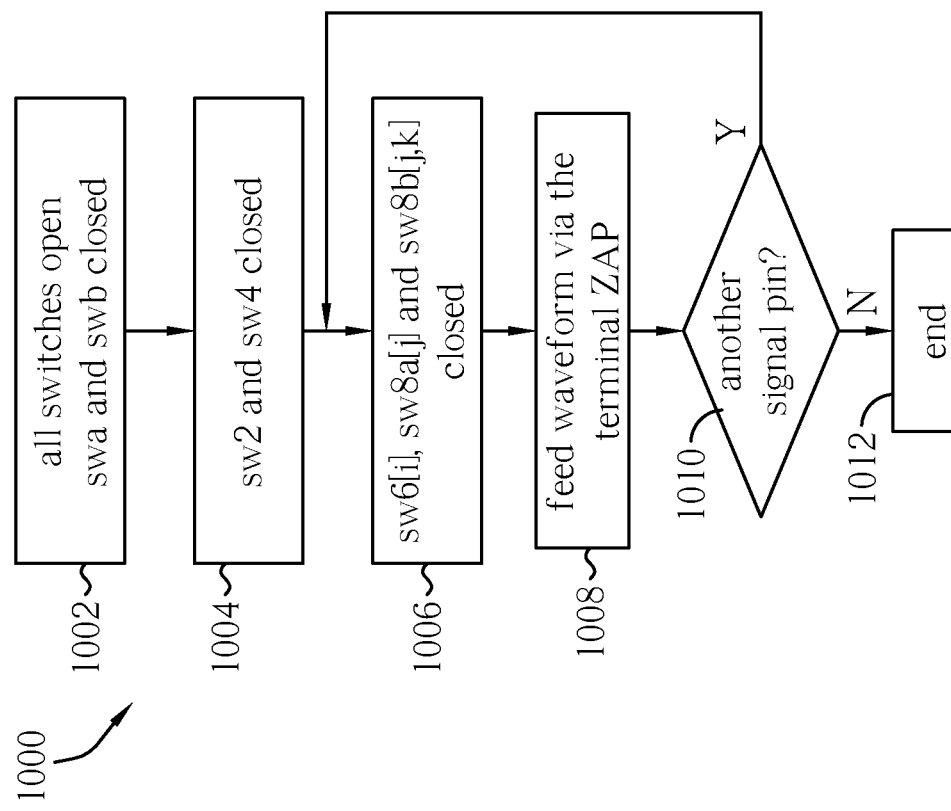
FIG. 20 illustrates a flow for an EOS check of a signal pin shown in FIG. 2 according to an embodiment of the invention.
Figure 21:
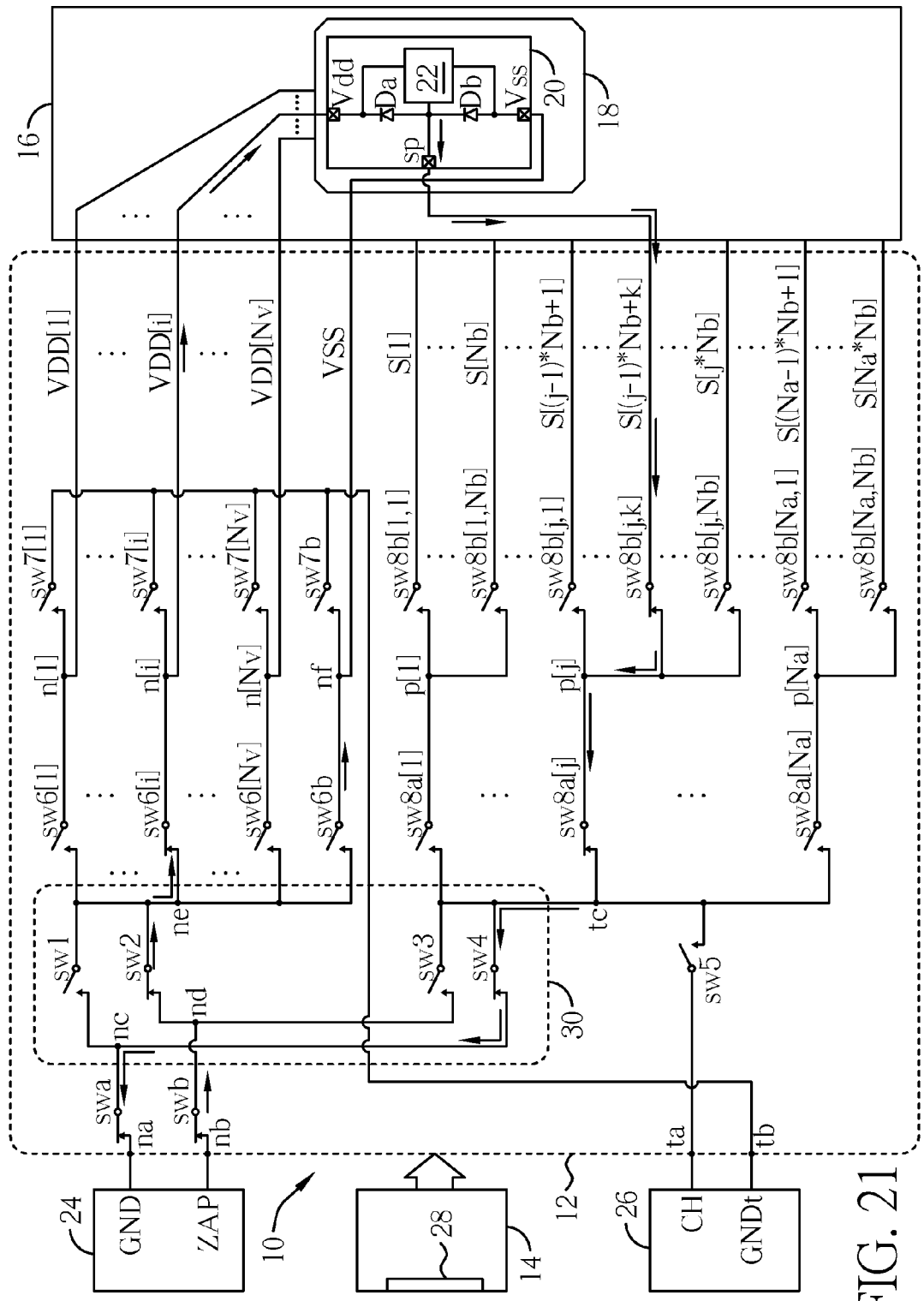
FIG. 21 illustrates execution of the flow in FIG. 20 by the electronic test system shown in FIG. 2.

Following the description of FIG. 3, please refer to FIG. 20 and FIG. 21; FIG. 20 illustrates a flow 1000 as one of the flows for EOS test of each signal pin according to an embodiment of the invention; during the step 108, the electronic test system 10 can perform the EOS test of the scenario 34b of FIG. 1 for a certain signal pin and a certain power pin of the chip 20 according to the flow 1000; for example, test EOS from the power pin Vdd to the signal pin sp, as shown in FIG. 21. Major steps of the flow 1000 can be described as follows.

Step 1002: control all the switches in the switch array 12 to be open, and then control the switches swa and swb to be closed for conduction.

Step 1004: control the switches sw2 and sw4 to be closed.

Step 1006: because EOS from the power pin Vdd to the signal pin sp is to be tested, and the signal pin sp and the power pin Vdd are respectively associated with the connection terminals S[(j−1)*Nb+k] and VDD[i], the switches sw8a[j] and sw8b[j,k] associated with the connection terminal S[(j−1)*Nb+k] are controlled to conduct, also the switch sw6[i] associated with the connection terminal VDD[i] is controlled to conduct.

Step 1008: utilize the signal generator 24 to feed the EOS test waveform via the signal terminals ZAP and GND. FIG. 21 illustrates process of the steps 1006 and 1008 via the connection terminal VDD[i] of the power pin Vdd and the connection terminal S[(j−1)*Nb+k] of the signal pin sp. The closed switches swb, sw2, sw6[i] conduct the signal terminal ZAP from the node nb to the nodes nd, ne and n[i], as well as the connection terminal VDD[i] and the power pin Vdd. The closed switches sw8b[j,k], sw8a[j], sw4 and swa conducts the signal pin sp from the connection terminal S[(j−1)*Nb+k] to the nodes p[j], tc, nc and na. Thus, the EOS waveform between the signal terminals ZAP and GND can be applied from the power pin Vdd to the signal pin sp, as shown in the scenario 34b.

Step 1010: if there is another pair of power/signal pins to be tested, then repeat the steps 1006 to 1008 for the power/signal pins. If there is no other signal/power pins to be tested, proceed to the step 1012.

Step 1012: end the flow 1000.

Because each switch of the switch array 12 (including the switches swa, swb, sw1 to sw4, sw6[1] to sw6[Nv], sw7[1] to sw7[Nv], sw6b, sw7b, sw8a[1] to sw8a[Na] and sw8b[1,1] to sw8b[Na,Nb]) are controlled to be open and closed by the switch control circuit 14, the electronic test system 10 can automatically execute the flow 100 according to procedure control. In an embodiment, the interface 28 of the switch control circuit 14 receives digital procedure control commands via a digital testing channel of a tester (e.g., the tester 26), wherein the digital procedure control commands can be transmitted as digital test pattern.

Equivalently, when the electronic test system 10 performs the flows 200 and/or 300, it operates in a switch circuit check mode to check the switches sw1 to sw4 of the switch circuit 30. While executing the flow 400, the electronic test system 10 operates in a switch check mode for checking the switches sw6[1] to sw6[Nv], sw6b, sw7[1] to sw7[Nv] and sw7b. While performing the flows 500 and/or 600, the electronic test system 10 operates in a continuity check mode to check signal continuity from signal pin to ground pin and/or to power pin. When the electronic test system executes the flows 700, 800, 900 and/or 1000, it operates in an EOS test mode.

To sum up, the electronic test system 10 of the invention implements automatic EOS test for the chip 20 with the switch array 12, and the switch array 12 is further equipped with self-check functions (such as the flows 200, 300 and 400). The electronic test system 10 also integrates current and voltage measurement functions of the tester 26. The electronic test system 10 can be re-used to test different kinds of chips; for example, by replacing the socket 18 and the circuit board 16, the same switch array 12 can be used to test another chip of another pin location and assignment. Hence, cost of testing chip can be greatly reduced. The electronic test system 10 can perform various programmable tests for chips of high pin count to satisfy different test requirements. The electronic test system 10 also avoids error of manual test, and effective decreases test time for chips of high pin count. The self-check function of the switch array 12 can be used to confirm whether each critical switch functions well. The electronic test system 10 can perform the continuity check of current and voltage (e.g., the flows 500 and/or 600) for each signal pin to ensure that the EOS test is effective, i.e., each signal pin is normal before the EOS test. After the EOS test, the electronic test system 10 can again perform the continuity check to reveal whether continuity of each signal pin is damaged by the applied EOS, and accordingly conclude whether each signal pin passes the EOS test. The result of continuity check can also be automatically recorded for further analysis.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic test system for testing a chip, comprising:
   a first connection terminal and a second connection terminal respectively coupled to two pins of the chip;
   a signal source terminal coupled to a signal generator;
   a first measurement terminal and a second measurement terminal coupled to a tester;
   a switch circuit comprising a first front terminal, a fourth front terminal, a first back terminal and a fourth back terminal, the first front terminal and the fourth front terminal being coupled to the signal source terminal, the first back terminal and the fourth back terminal being respectively coupled to the first connection terminal and the second connection terminal; wherein the switch circuit controls conduction between the first front terminal and the first back terminal, and controls conduction between the fourth front terminal and the fourth back terminal;
   a fifth switch coupled between the fourth back terminal and the first measurement terminal for selectively conducting between the fourth back terminal and the first measurement terminal; and
   a seventh switch coupled between the first connection terminal and the second measurement terminal for selectively conducting between the first connection terminal and the second measurement terminal;
   wherein the electronic test system operates in a check mode and a test mode; when the electronic test system operates in the check mode, the fifth switch conducts; when the electronic test system operates in the test mode, both the fifth switch and the seventh switch do not conduct.

2. The electronic test system of claim 1, wherein the electronic test system operates in a second check mode; when the electronic test system operates in the check mode, the seventh switch conducts; when the electronic test system operates in the second check mode, the switch circuit conducts between the first front terminal and the first back terminal, and conducts between the fourth front terminal and the fourth back terminal.

3. The electronic test system of claim 1 further comprising:
   a sixth switch coupled between the first back terminal and the first connection terminal for selectively conducting between the first back terminal and the first connection terminal.

4. The electronic test system of claim 3 further operating in a second check mode; when the electronic test system operates in the check mode, the sixth switch conducts; when the electronic test system operates in the second check mode, the switch circuit conducts between the first front terminal and the first back terminal, and conducts between the fourth front terminal and the fourth back terminal.

5. The electronic test system of claim 1 further comprising:
   a source switch coupled between the signal source terminal and the first front terminal for selectively conducting between the signal source terminal and the first front terminal;
   wherein the first front terminal is further coupled to the fourth front terminal; when the electronic test system operates in the check mode, the source switch does not conduct; when the electronic test system operates in the test mode, the source switch conducts.

6. The electronic test system of claim 1 further comprising:
   an eighth switch coupled between the fourth back terminal and the second connection terminal for selectively conducting between the fourth back terminal and the second connection terminal;
   wherein when the electronic test system operates in the test mode, the eighth switch conducts.

7. The electronic test system of claim 1 further comprising a second signal source terminal coupled to the signal generator; wherein the switch circuit further comprising a second front terminal, a third front terminal, a second back terminal and a third back terminal, the second front terminal and the third front terminal are coupled to the second signal source terminal, the second back terminal and the third back terminal are respectively coupled to the first connection terminal and the second connection terminal; the switch circuit further controls conduction between the second front terminal and the second back terminal, and controls conduct between the third front terminal and the third back terminal.

8. The electronic test system of claim 7, wherein when the electronic test system operates in the check mode, the switch circuit operates in a first switch mode and a second switch mode; when the switch circuit operates in the first switch mode, the switch circuit does not conduct between the second front terminal and the second back terminal, and does not conduct between the third front terminal and the third back terminal; when the switch circuit operates in the second switch mode, the switch circuit does not conduct between the first front terminal and the first back terminal, and does not conduct between the fourth front terminal and the fourth back terminal.

9. The electronic test system of claim 7, wherein the electronic test system operates in a second check mode; when the electronic test system operates in the second check mode, the switch circuit conducts between the first front terminal and the first back terminal, and conducts between the fourth front terminal and the fourth back terminal.

10. The electronic test system of claim 7, wherein the electronic test system operates in a third check mode; when the electronic test system operates in the third check mode, the switch circuit does not conduct between the first front terminal and the first back terminal, does not conduct between the second front terminal and the second back terminal, does not conduct between the third front terminal and the third back terminal, and does not conduct between the fourth front terminal and the fourth back terminal.

11. A method applied to an electronic test system, the electronic test system being arranged to test a chip, and comprising a first connection terminal, a second connection terminal, a signal source terminal, a first measurement terminal, a second measurement terminal and a switch circuit; wherein the signal source terminal is coupled to a signal generator, the first connection terminal and the second connection terminal are respectively coupled to two pins of the chip, the first measurement terminal and the second measurement terminal are coupled to a tester, the switch circuit comprises a first front terminal, a fourth front terminal, a first back terminal and a fourth back terminal, the first front terminal is coupled to the fourth front terminal and the signal source terminal, the first back terminal and the fourth back terminal are respectively coupled to the first connection terminal and the second connection terminal, and the switch circuit controls conduction between the first front terminal and the first back terminal, and controls conduction between the fourth front terminal and the fourth back terminal; and the method comprising:

for function check of the switch circuit, conducting the first measurement terminal to the fourth back terminal, conducting the second measurement terminal to the first back terminal, and not conducting between the signal source terminal and the first front terminal.

12. The method of claim 11 further comprising:

for checking continuity between the two pins, controlling the switch circuit not to conduct between the first front terminal and the first back terminal, and not to conduct between the fourth front terminal and the fourth back terminal.

13. The method of claim 11, wherein the electronic test system further comprises a sixth switch and a seventh switch, the sixth switch is coupled between the first back terminal and the first connection terminal for selectively conducting between the first back terminal and the first connection terminal, and the seventh switch is coupled between the second measurement terminal and the first connection terminal for selectively conducting between the second measurement terminal and the first connection terminal; and the method further comprising:

for checking the sixth switch and the seventh switch, controlling the switch circuit to conduct between the first front terminal and the first back terminal, and to conduct between the fourth front terminal and the fourth back terminal; and, not conducting between the signal source terminal and the first front terminal.

14. The method of claim 13, wherein the electronic test system further comprises a second signal source terminal coupled to the signal generator, the switch circuit further comprises a second front terminal, a third front terminal, a second back terminal and a third back terminal, the second front terminal and the third front terminal are coupled to the second signal source terminal, the second back terminal and the third back terminal are respectively coupled to the first connection terminal and the second connection terminal, and the switch circuit further controls conduction between the second front terminal and the second back terminal, and controls conduction between the third front terminal and the third back terminal; and the method further comprising:

controlling the seventh switch not to conduct, controlling the sixth switch to conduct, and controlling the switch circuit to conduct between the first front terminal and the first back terminal, not to conduct between the second front terminal and the second back terminal, not to conduct between the fourth front terminal and the fourth back terminal, and to conduct between the third front terminal and the third back terminal, such that the signal source terminal and the second signal source terminal are respectively conducted to the two pin via the first connection terminal and the second connection terminal.

15. The method of claim 14 further comprising:

controlling the seventh switch not to conduct, controlling the sixth switch to conduct, controlling the switching not to conduct between the first front terminal and the first back terminal, to conduct between the second front terminal and the second back terminal, to conduct between the fourth front terminal and the fourth back terminal, and not to conduct between the third front terminal and the third back terminal, such that the signal source terminal and the second signal source terminal are respectively conducted to the two pin via the second connection terminal and the first connection terminal.

* * * * *